(12) United States Patent
Komatsu

(10) Patent No.: US 9,807,870 B2
(45) Date of Patent: Oct. 31, 2017

(54) PRINTED WIRING BOARD

(71) Applicant: FUJIKURA LTD., Tokyo (JP)

(72) Inventor: Naomi Komatsu, Sakura (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 15/305,232

(22) PCT Filed: May 15, 2015

(86) PCT No.: PCT/JP2015/064049
§ 371 (c)(1),
(2) Date: Oct. 19, 2016

(87) PCT Pub. No.: WO2015/178313
PCT Pub. Date: Nov. 26, 2015

(65) Prior Publication Data
US 2017/0048968 A1 Feb. 16, 2017

(30) Foreign Application Priority Data
May 21, 2014 (JP) .................................. 2014-105107

(51) Int. Cl.
*H05K 1/02* (2006.01)
*H01P 3/08* (2006.01)
(Continued)

(52) U.S. Cl.
CPC ........... *H05K 1/0228* (2013.01); *H01P 3/085* (2013.01); *H01P 11/003* (2013.01);
(Continued)

(58) Field of Classification Search
CPC .......... H01P 3/08; H01P 3/088; H01P 11/003; H01P 3/085; C09J 171/12; H05K 1/0237;
(Continued)

(56) References Cited

U.S. PATENT DOCUMENTS

2003/0116343 A1 6/2003 Adachi et al.
2005/0067187 A1 3/2005 Hsu
(Continued)

FOREIGN PATENT DOCUMENTS

CN 1427662 A 7/2003
CN 102791074 A 11/2012
(Continued)

OTHER PUBLICATIONS

Japanese Notice of Reasons for Refusal for JP 2014-105107 dated Jul. 22, 2014.
(Continued)

*Primary Examiner* — Benny Lee
*Assistant Examiner* — Jorge Salazar, Jr.
(74) *Attorney, Agent, or Firm* — Osha Liang LLP

(57) ABSTRACT

A printed wiring board is provided which comprises a first insulating substrate (11) composed of a liquid crystal polymer, a first signal line (131) formed on one main surface (11a) of the first insulating substrate (11), a second insulating substrate (21) composed of a liquid crystal polymer, a second signal line (231) formed on one main surface (21a) of the second insulating substrate (21) and along the extending direction of the first signal line (131), and an adhesion layer (30) composed of a modified polyphenylene ether for adhesion between the one main surface (11a) of the first insulating substrate (11) and the one main surface (21a) of the second insulating substrate (21). When frequencies of signals transmitted by the first signal line and the second signal line are 2.5 GHz or more and 5.0 GHz or less, an offset amount is longer than a circuit width (L1) of the first signal line (131) and 130 μm or more and 300 μm or less. The offset amount is a distance from the position of one end of the first signal line (131) among ends along the width (Continued)

direction to the position of one end of the second signal line (231) among ends along the width direction.

3 Claims, 23 Drawing Sheets

(51) Int. Cl.
*H01P 11/00* (2006.01)
*H05K 3/46* (2006.01)
*C09J 171/12* (2006.01)
*H05K 1/03* (2006.01)
*H05K 3/42* (2006.01)

(52) U.S. Cl.
CPC ......... *H05K 1/0237* (2013.01); *H05K 3/4635* (2013.01); *C09J 171/12* (2013.01); *H01P 3/088* (2013.01); *H05K 1/0225* (2013.01); *H05K 1/03* (2013.01); *H05K 3/429* (2013.01); *H05K 2201/0141* (2013.01); *H05K 2203/061* (2013.01)

(58) Field of Classification Search
CPC ...... H05K 1/03; H05K 3/4635; H05K 1/0228; H05K 2201/0141; H05K 2203/061; H05K 3/4292; H05K 1/118; H05K 1/147; H05K 3/361; H05K 3/4691; H05K 2201/05; H05K 2001/2009; H05K 1/0225
USPC ...................... 333/1, 4, 5, 12, 236, 238, 246
See application file for complete search history.

(56) References Cited

U.S. PATENT DOCUMENTS

| | | |
|---|---|---|
| 2008/0266019 A1 | 10/2008 | Fusayasu et al. |
| 2012/0292085 A1 | 11/2012 | Watanabe |
| 2015/0195921 A1 | 7/2015 | Onodera et al. |

FOREIGN PATENT DOCUMENTS

| | | |
|---|---|---|
| CN | 104663007 A | 5/2015 |
| JP | 2003-101432 A | 4/2003 |
| JP | 2006-42098 A | 2/2006 |
| JP | 2009-10328 A | 1/2009 |
| JP | 2011-130395 A | 6/2011 |
| JP | 2012-243923 A | 12/2012 |
| TW | 200513162 A | 4/2005 |
| TW | 200835421 A | 8/2008 |
| WO | 2014/046014 A1 | 3/2014 |

OTHER PUBLICATIONS

International Search Report for PCT/JP2015/064049 dated Aug. 4, 2015.
Communication dated Oct. 24, 2016, issued by the Taiwan Intellectual Property Office in corresponding Taiwanese Application No. 104116000.
Office Action issued in corresponding Chinese Application No. 201580020126.8 dated Mar. 24, 2017, and English translation thereof (10 pages).

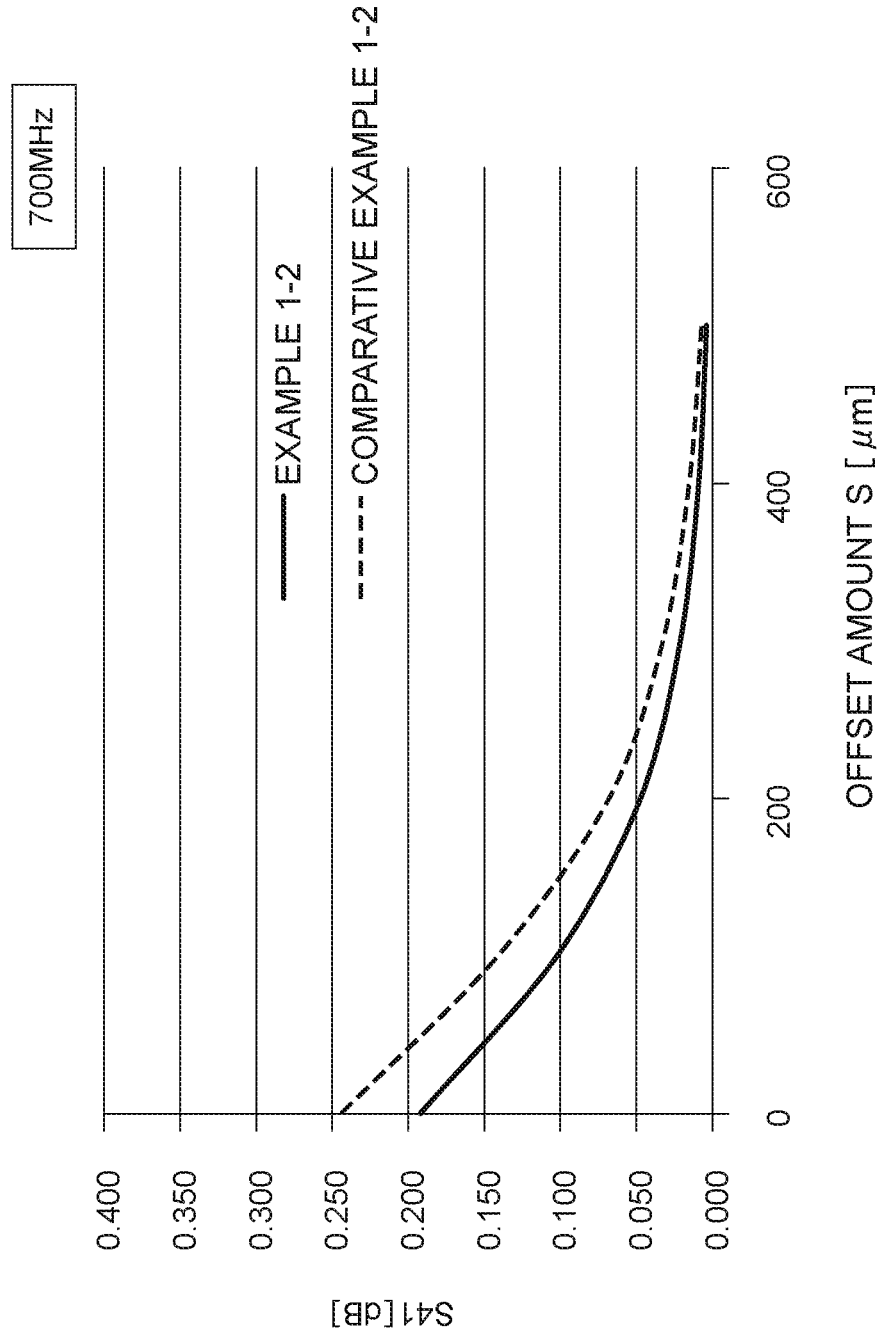

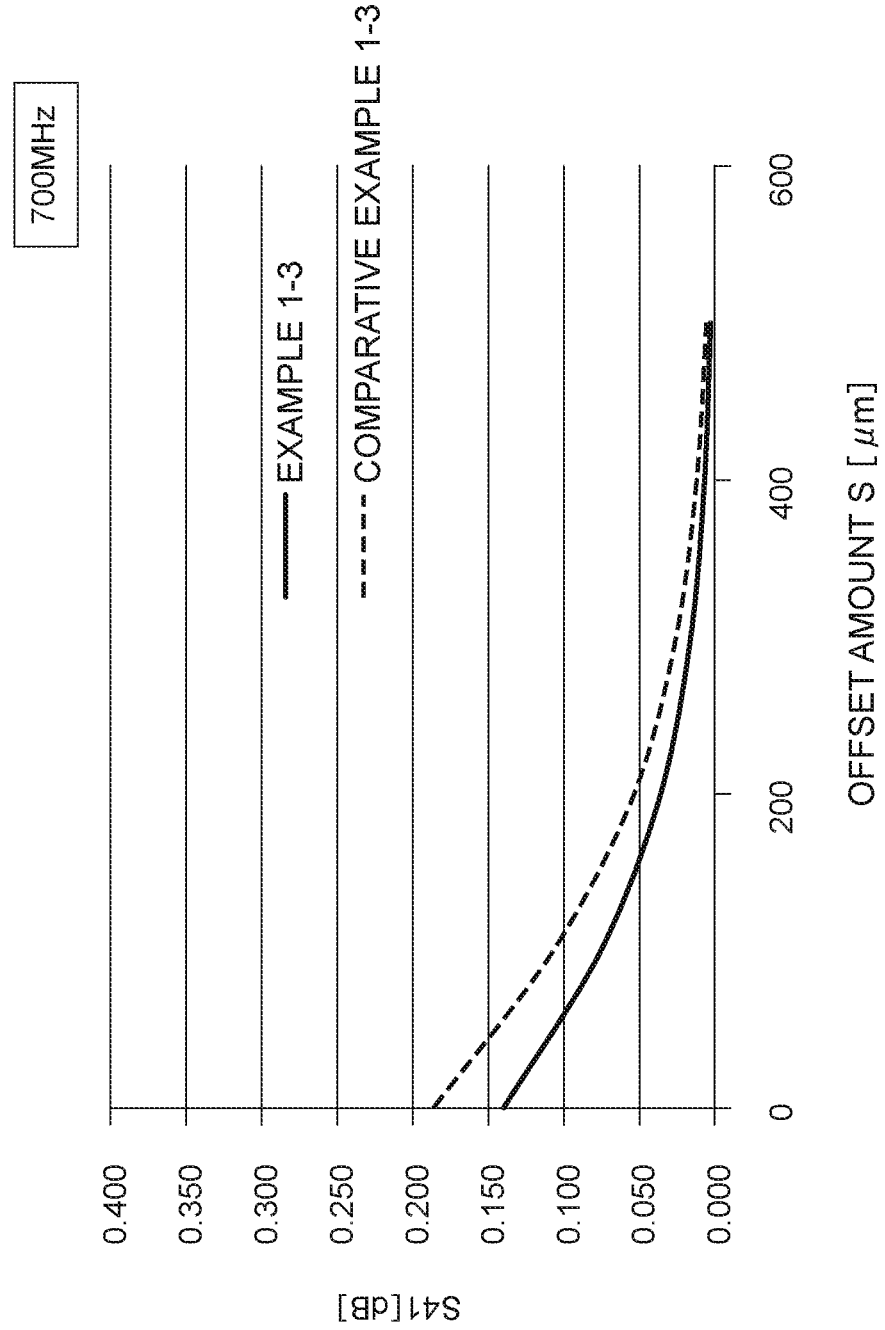

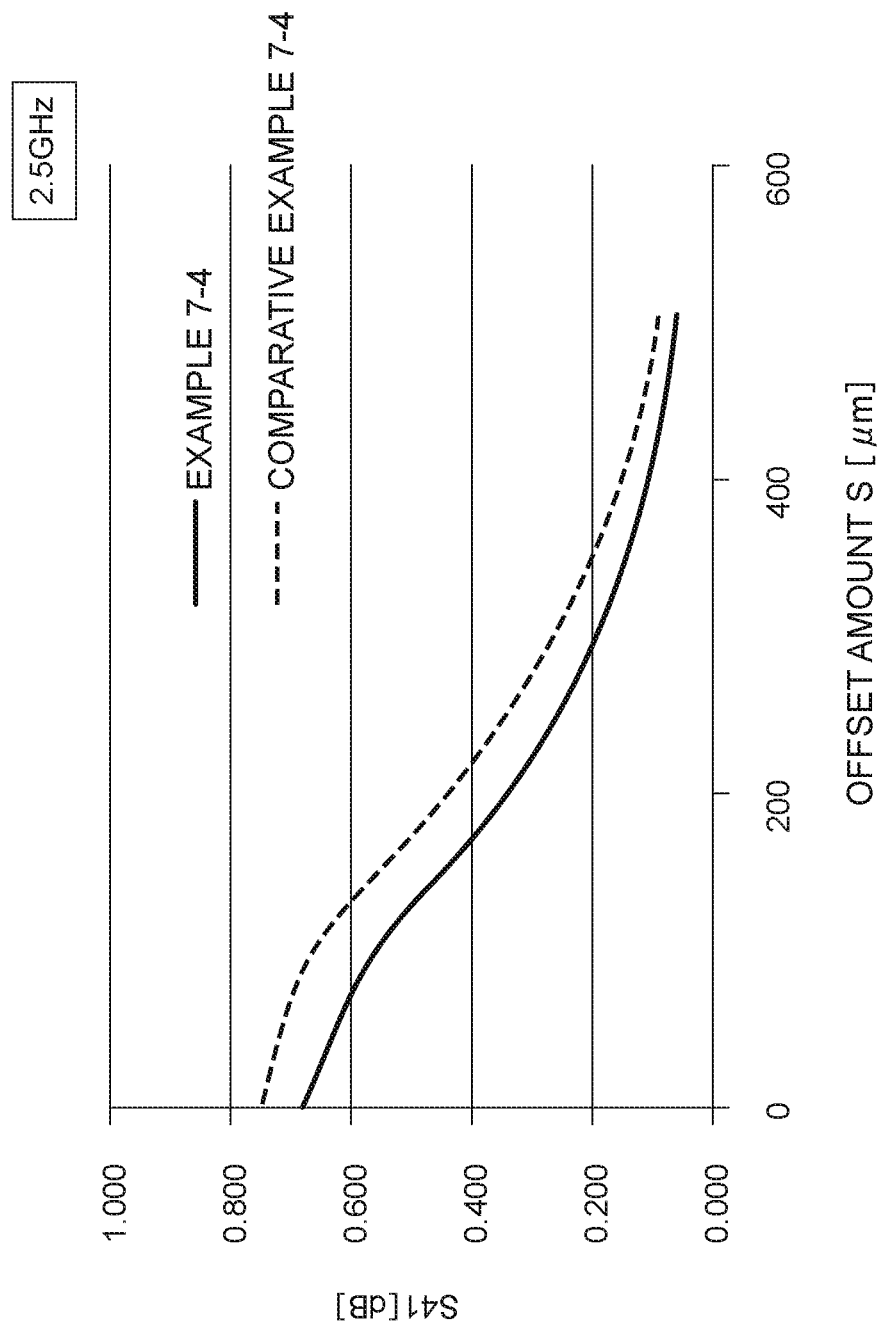

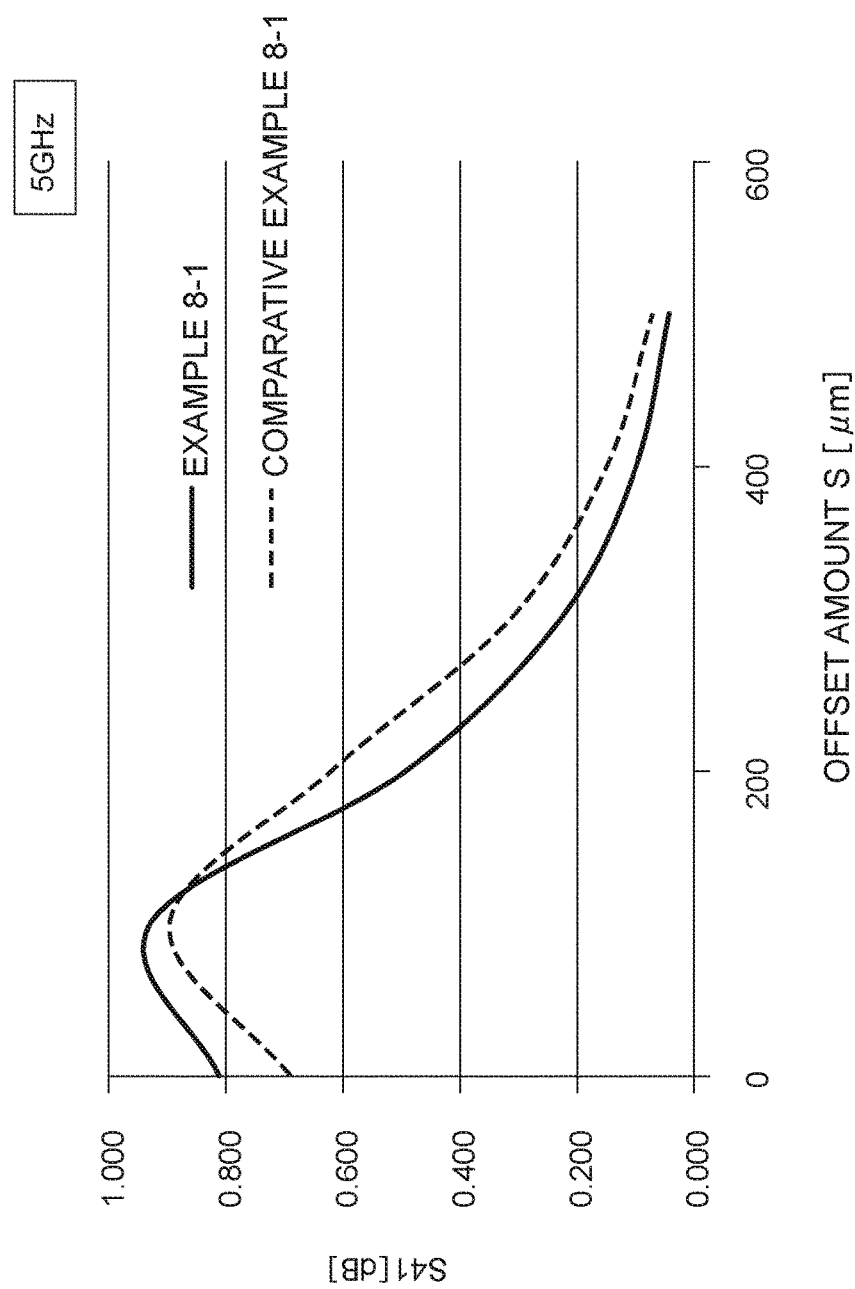

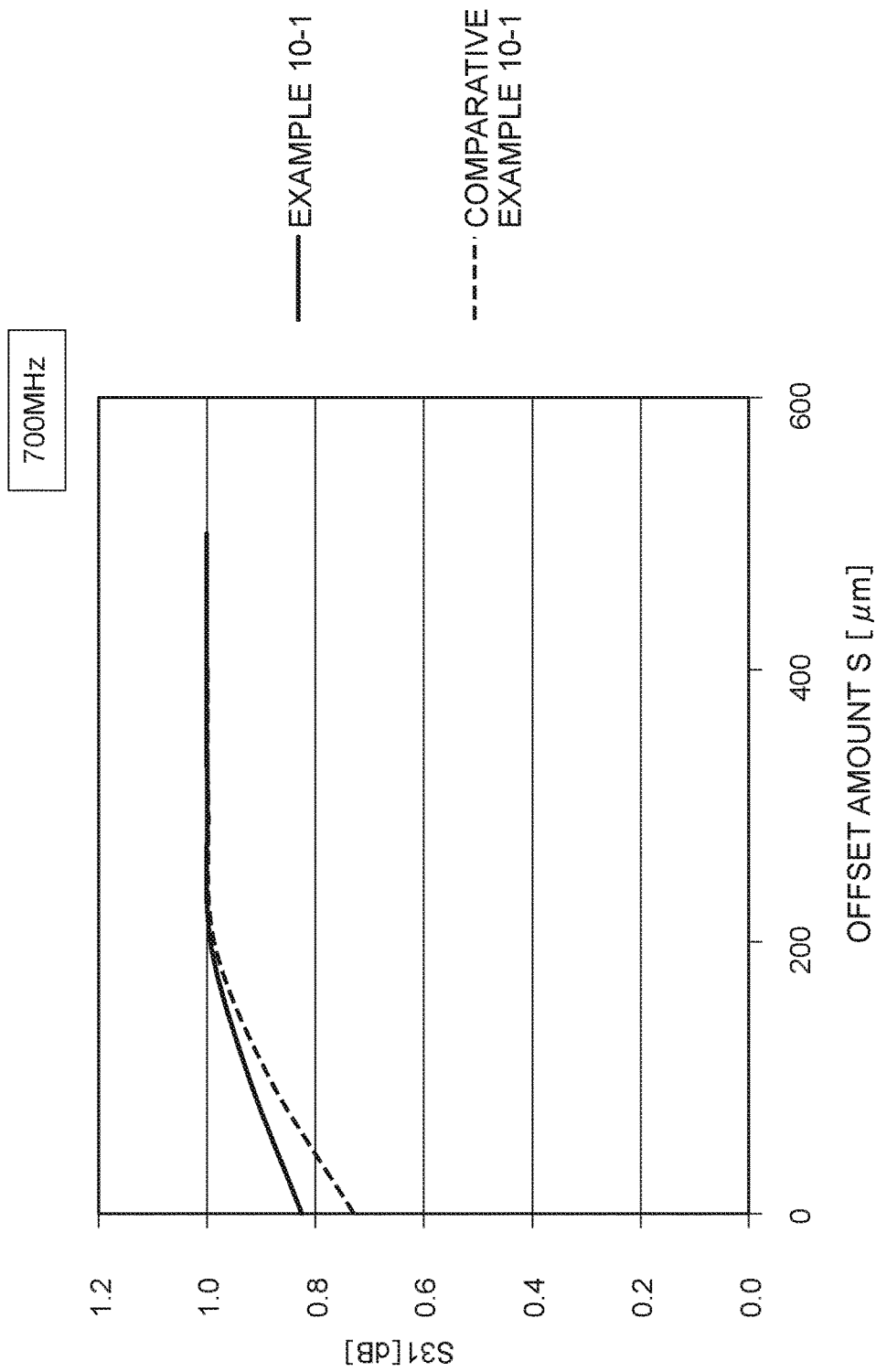

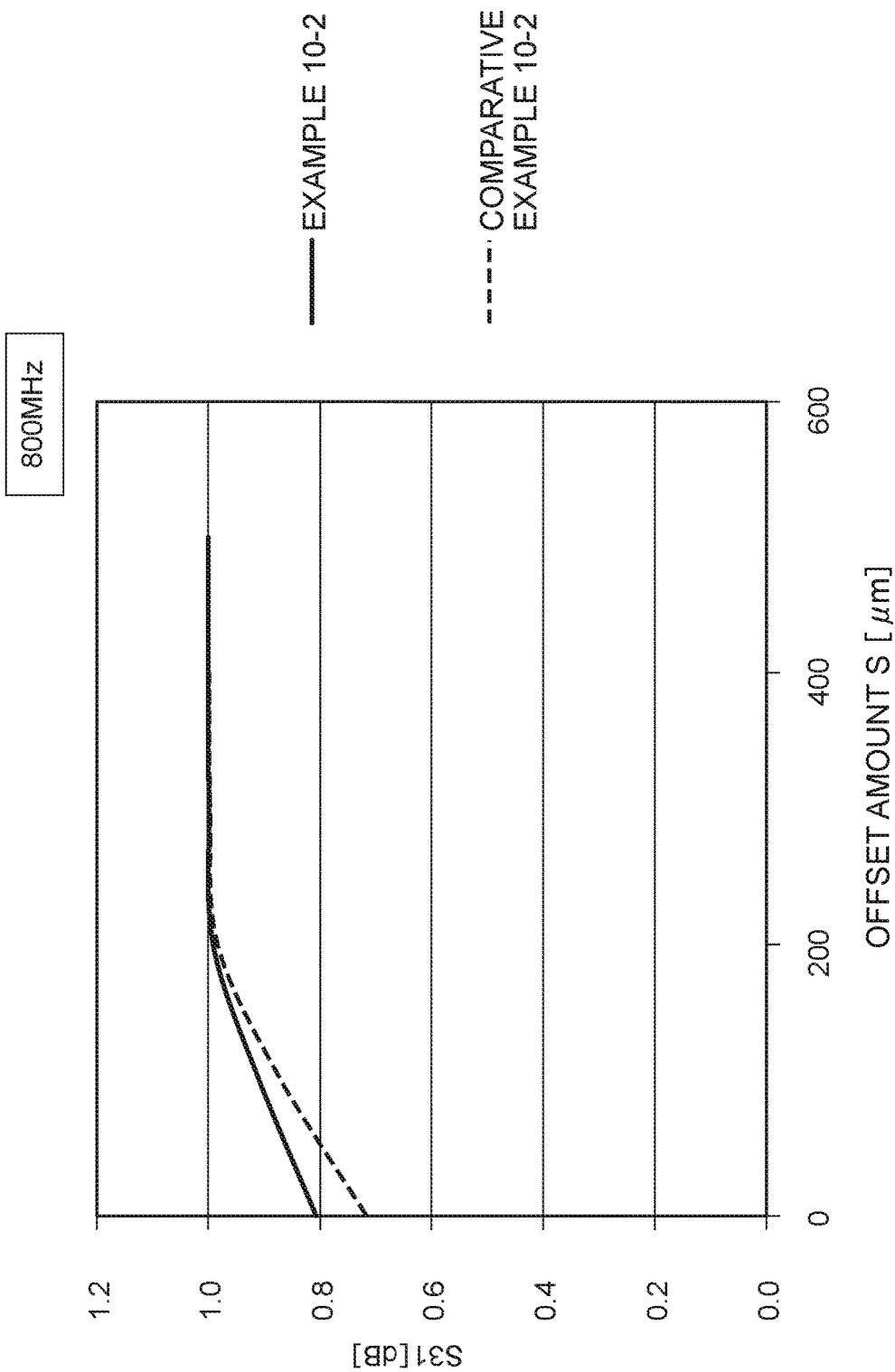

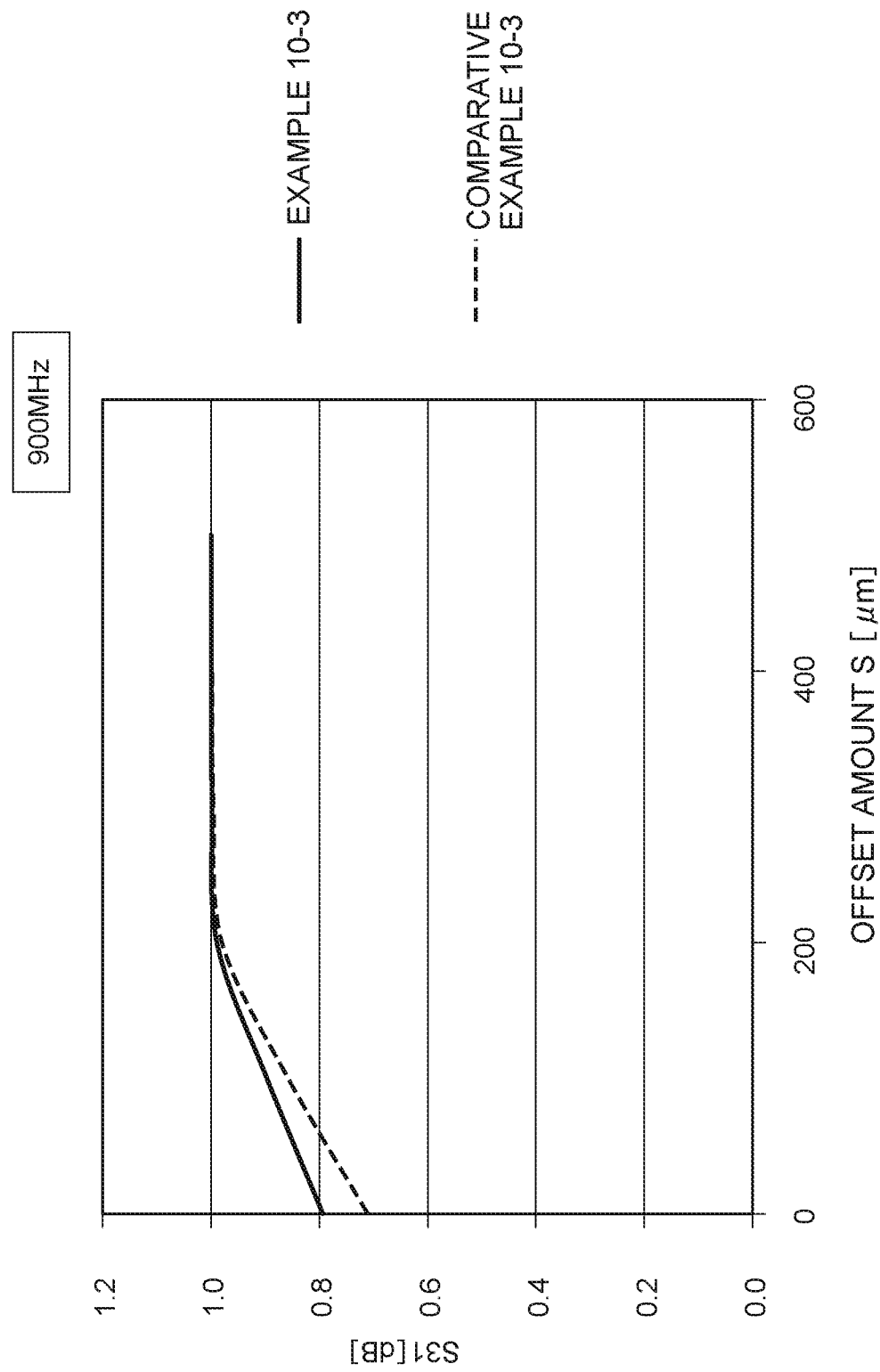

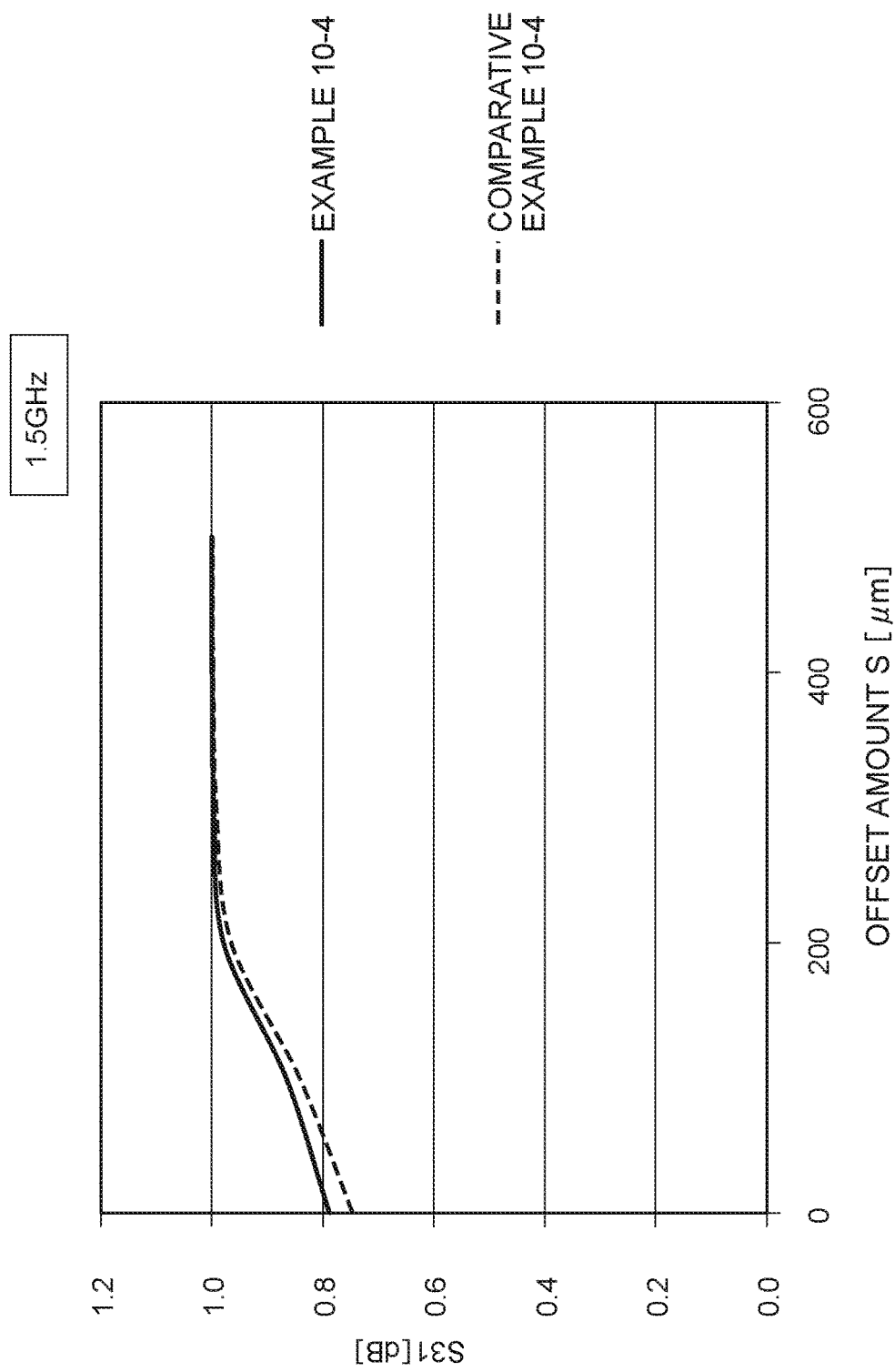

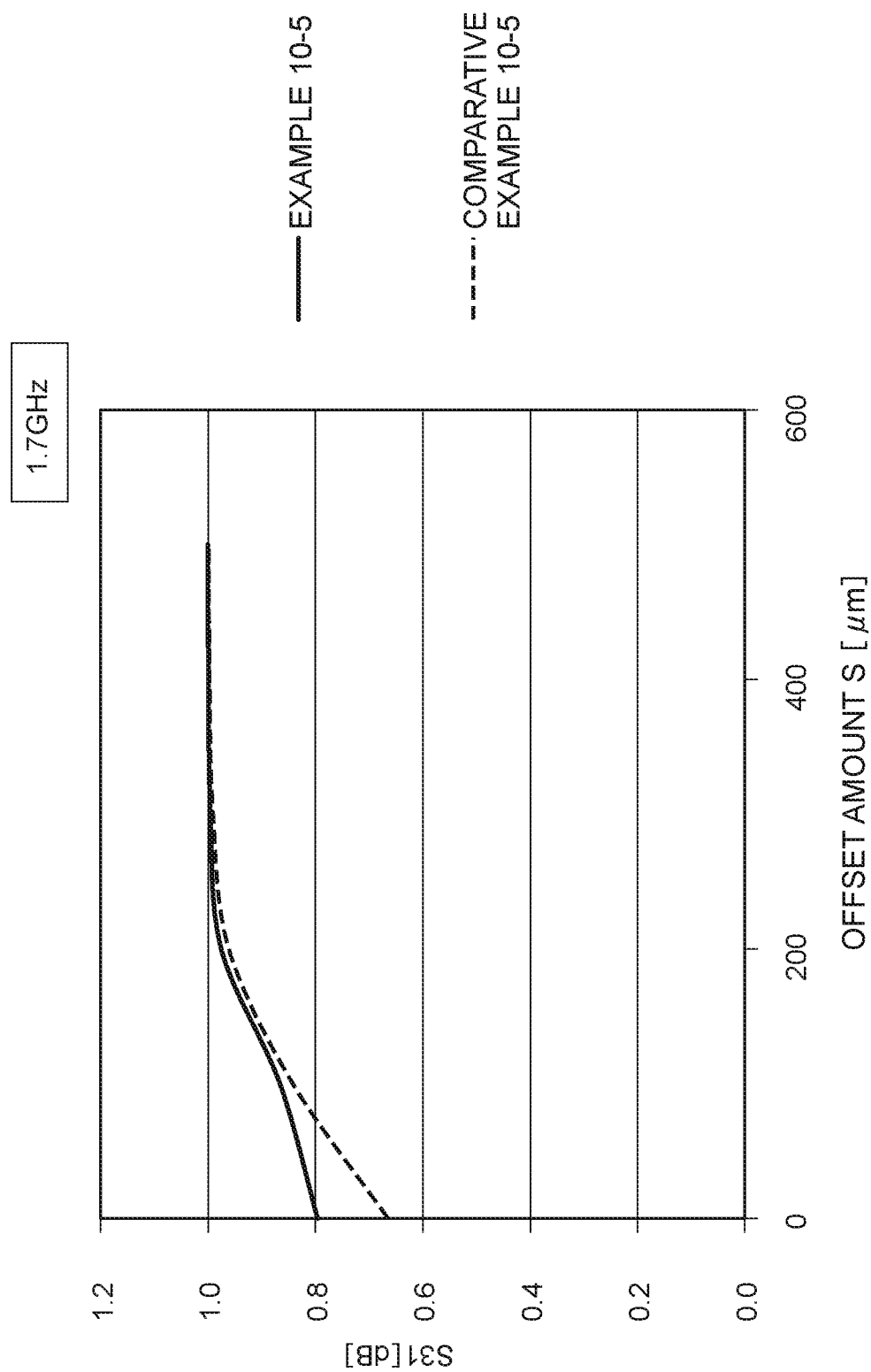

PRINTED WIRING BOARD

CROSS REFERENCE TO RELATED APPLICATIONS

This application is a National Stage of International Application No. PCT/JP2015/064049 filed May 15, 2015, claiming priority based on Japanese Patent Application No. 2014-105107 filed May 21, 2014, the contents of all of which are incorporated herein by reference in their entirety.

TECHNICAL FIELD

The present invention relates to a printed wiring board.

BACKGROUND ART

In view of improving the transmission characteristics for high-frequency waves while achieving dense circuits, flexible printed circuits are known in which adhesive layers using an epoxy-based thermosetting adhesive are formed between unit substrates to be laminated (Patent Document 1: JP 2012-243923 A).

PRIOR ART DOCUMENT

Patent Document

[Patent Document] JP 2012-243923 A

SUMMARY OF INVENTION

Problems to be Solved by Invention

There is a problem, however, in that the transmission characteristics when transmitting high-frequency signals are insufficient because the permittivity of the epoxy-based thermosetting adhesive is high.

Problems to be solved by the present invention include providing a printed wiring board that has high transmission characteristics when transmitting high-frequency signals and also has a high wiring density.

Means for Solving Problems (1) The present invention solves the above problems by providing a printed wiring board comprising: a first insulating substrate composed of a liquid crystal polymer; a first signal line formed on one main surface of the first insulating substrate; a second insulating substrate composed of a liquid crystal polymer; a second signal line formed on one main surface of the second insulating substrate and along an extending direction of the first signal line; and an adhesion layer composed of a modified polyphenylene ether for adhesion between the one main surface of the first insulating substrate and the one main surface of the second insulating substrate, wherein the printed wiring board is characterized in that, when frequencies of signals transmitted by the first signal line and the second signal line are 2.5 GHz or more and 5.0 GHz or less, an offset amount is longer than a circuit width of the first signal line and 130 [μm] or more and 300 [μm] or less, wherein the offset amount is a distance between a position of one end of the first signal line farthest from the second signal line among ends along a width direction of the first signal line and a position of one end of the second signal line nearest to the first signal line among ends along a width direction of the second signal line.

(2) In the above invention, the above problems are solved by setting the offset amount to 200 μm or less.

(3) In the above invention, the above problems are solved by providing a printed wiring board characterized in that the first signal line transmits a signal of a first frequency and the second signal line transmits a signal of a second frequency that is different from the first frequency.

Effect of Invention

According to the present invention, the amount of accumulated pitches between the signal lines can be suppressed because the distance between the signal lines can be reduced while maintaining the transmission characteristics. This can result in providing a printed wiring board that has high transmission characteristics when transmitting high-frequency signals and also has a high wiring density.

BRIEF DESCRIPTION OF DRAWINGS

FIG. 4B is a graph illustrating measurement results of crosstalk S41 at a frequency of 700 MHz when the offset amount S is varied in Structure 2 where circuit width L is 50 μm and distance between conductors D is 30 μm in a structure shown in FIG. 3.

FIG. 4C is a graph illustrating measurement results of crosstalk S41 at a frequency of 700 MHz when the offset amount S is varied in Structure 3 where circuit width L is 25 μm and distance between conductors D is 30 μm in a structure shown in FIG. 3.

FIG. 5D is a graph illustrating measurement results of crosstalk S41 at a frequency of 2.5 GHz when the offset amount S is varied in Structure 4.

FIG. 6A is a graph illustrating measurement results of crosstalk S41 at a frequency of 5 GHz when the offset amount S is varied in Structure 1.

FIG. 7A is a graph illustrating measurement results of crosstalk S31 at a frequency of 700 MHz when the offset amount S is varied in Structure 1.

FIG. 7B is a graph illustrating measurement results of crosstalk S31 at a frequency of 800 MHz when the offset amount S is varied in Structure 1.

FIG. 7C is a graph illustrating measurement results of crosstalk S31 at a frequency of 900 MHz when the offset amount S is varied in Structure 1.

FIG. 7D is a graph illustrating measurement results of crosstalk S31 at a frequency of 1.5 GHz when the offset amount S is varied in Structure 1.

FIG. 7E is a graph illustrating measurement results of crosstalk S31 at a frequency of 1.7 GHz when the offset amount S is varied in Structure 1.

MODE(S) FOR CARRYING OUT THE INVENTION

Hereinafter, embodiments of the present invention will be described with reference to the drawings. In the present embodiment, examples will be described in which a printed wiring board 1 according to the present invention is applied to transmission lines that connect between circuits in a device, between a circuit and a device, or between devices. The printed wiring board 1 according to the present embodiment is suitable for transmission of high speed signals and can perform transmission of signals based on various standards, such as LVDS, MIPI, HDMI (registered trademark) and USB.

Figure 1:
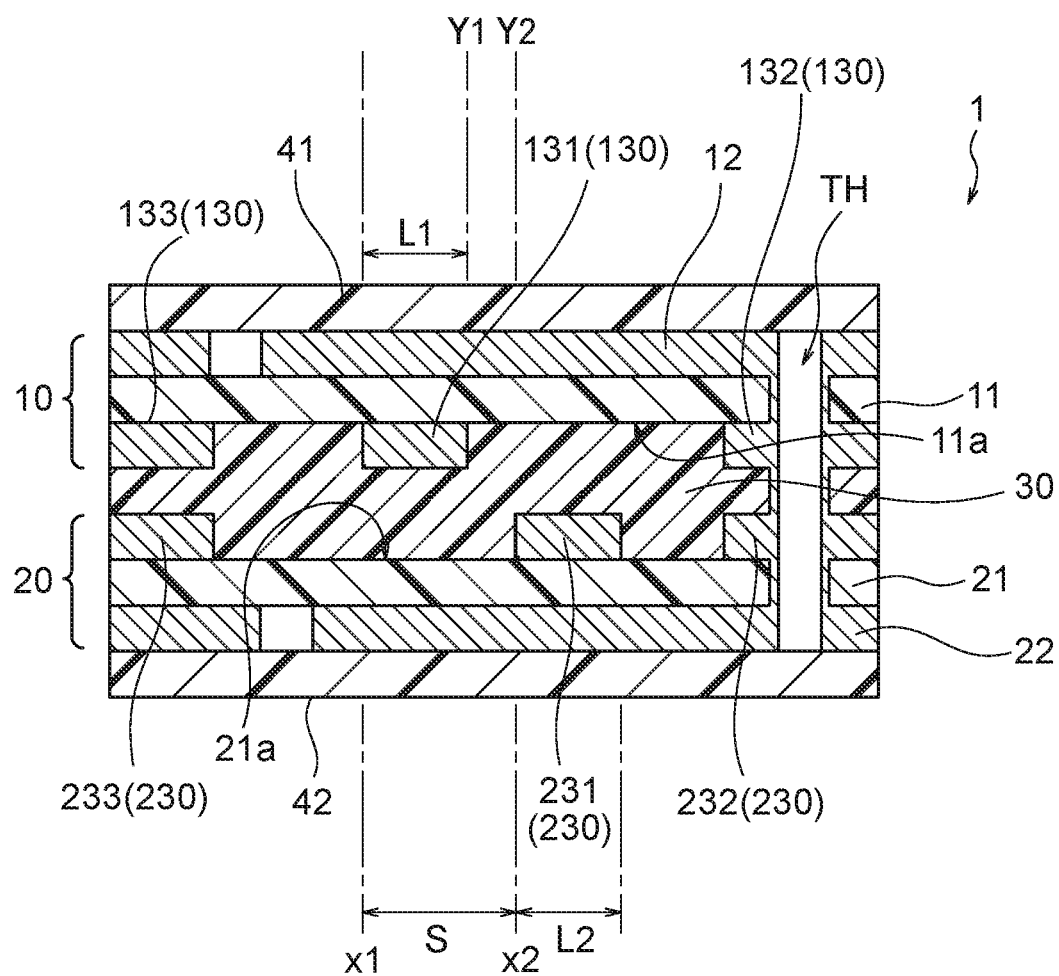
FIG. 1 is a cross-sectional view of a printed wiring board according to an embodiment of the present invention.

FIG. 1 is a cross-sectional view of the printed wiring board 1 according to the present embodiment. As illustrated in FIG. 1, the printed wiring board 1 of the present embodiment has a laminate structure in which a first substrate 10 and a second substrate 20 are laminated. FIG. 1 illustrates an example in which the first substrate 10 is laminated at the upper side of the second substrate 20, but an inverted structure is also possible.

The first substrate 10 comprises a first insulating substrate 11, first signal lines 131, 132 and 133 (which may be collectively referred to as a "first signal line 130" or "first signal lines 130") formed on one main surface 11a (lower side in the figure) of the first insulating substrate 11, and a first ground layer 12 formed on the other main surface (upper side in the figure) of the first insulating substrate 11. In the printed wiring board 1 illustrated in FIG. 1, the first ground layer 12 is covered with a first protection layer 41.

The second substrate 20 comprises a second insulating substrate 21, second signal lines 231, 232 and 233 (which may be collectively referred to as a "second signal line 230" or "second signal lines 230") formed on one main surface 21a (upper side in the figure) of the second insulating substrate 21, and a second ground layer 22 formed on the other main surface (lower side in the figure) of the second insulating substrate 21. In the printed wiring board 1 illustrated in FIG. 1, the second ground layer 22 is covered with a second protection layer 42.

In the present embodiment illustrated in FIG. 1, the second signal line 231 is formed along the extending direction of the first signal line 131. In the present embodiment, the extending direction of the first signal line 131 and the extending direction of the second signal line 231 are approximately parallel to each other. That is, the first signal line 131 and the second signal line 231 are in a parallel relationship. In the present embodiment illustrated in FIG. 1, the first signal line 131 and the second signal line 231 are disposed at positions that are shifted in the width direction of the signal lines. In the present embodiment, an offset amount S, which is the distance from a position (X1) of one end of the first signal line 131 farthest from the position of the second signal line 231 along the width direction (horizontal direction in the figure) to a position (X2) of one end of the second signal line 231 nearest to the position of the first signal line 131 along the width direction (horizontal direction in the figure), is longer than a circuit width L1 of the first signal line 131. That is, as illustrated in FIG. 1, the first signal line 131 of the first substrate 10 and the second signal line 231 of the second substrate 20, which are laminated with each other, are disposed at shifted positions in the width direction (horizontal direction in the figure) so as not to oppose each other. In other words, the distance between the position (Y1) of the other end of the first signal line 131 nearest to the second signal line 231 along the width direction and the position (Y2) of the other end of the second signal line 231 nearest to the first signal line 131 along the width direction is a value that is larger than 0 (zero).

In the printed wiring board 1 illustrated in FIG. 1, although not particularly limited, it is preferred that the offset amount S, which is a distance from the position X1 of the one end of the first signal line 131 along the width direction to the position X2 of the one end of the second signal line 231 along the width direction, is 300 [μm] or less. When the circuit width L1 of the first signal line 131 is 100 [m], the distance from the position (Y1) nearest to the second signal line 231 along the width direction of the first signal line 131 to the position (Y2) nearest to the first signal line 131 along the width direction of the second signal line 231, that is, the distance between the first signal line 131 and the second signal line 231 in the circuit width direction, is 200 [μm]. Moreover, in the present embodiment, it is preferred that the offset amount is 200 [μm] or less. In this case, when the circuit width L1 of the first signal line 131 is 100 [μm], the distance from the position (Y1) nearest to the second signal line 231 along the width direction of the first signal line 131 to the position (Y2) nearest to the first signal line 131 along the width direction of the second signal line 231, that is, the distance between the first signal line 131 and the second signal line 231 in the direction along the circuit width, is 100 [μm].

The circuit width L1 of the first signal line 131 and the circuit width L2 of the second signal line 231 may have the same value or different values. The thicknesses of the first signal line 131 and second signal line 231 may have the same value or different values. The relationship between the first signal line 131 as an example of the first signal lines 130 and the second signal line 231 as an example of the second signal lines 230 is described herein, but the same can be applied to the relationships between other first signal lines 130 (not illustrated) formed on the one main surface 11a of the first insulating substrate 11 and other second signal lines 230 (not illustrated) formed on the one main surface 21a of the second insulating substrate 21. The printed wiring board 1 of the present embodiment can be configured to comprise a plurality of signal lines that correspond to the first signal line 131 and second signal line 231 illustrated in FIG. 1.

Although not particularly limited, in the present embodiment, the first signal line 131 transmits a signal of a first frequency and the second signal line 231 transmits a signal of a second frequency that is different from the first frequency. In recent years, smartphones and tablet terminals are required to have an enhanced processing speed for signals, and it is also demanded for the printed wiring board 1 as a component to have improved transmission characteristics for high-frequency waves. In addition, it is desired to be able to transmit signals of a plurality of frequencies because the frequency band for mobile phones is different in each carrier. According to the present embodiment, by ensuring stable transmission characteristics in each signal line, a plurality of signal lines can be provided which are separate and independent and transmit signals of different frequencies. Thus, the present embodiment provides the printed wiring board 1 which can transmit, with enhanced characteristics, signals of a plurality of frequencies in a wide frequency band including high frequencies.

The first insulating substrate 11 and the second insulating substrate 21 are composed of a material that contains a liquid crystal polymer (referred also to as an "LCP," hereinafter). The first insulating substrate 11 and second insulating substrate 21 of the present embodiment are composed of a liquid crystal polymer. The liquid crystal polymer of the present embodiment is not particularly limited, provided that it is a resin that exhibits liquid-crystalline properties in the molten state. It may be a polyester-based liquid crystal polymer or an aramid-based liquid crystal polymer.

The first signal lines 130 and the second signal lines 230 are composed of an electrically-conductive material, such as copper, silver and gold. The first ground layer 12 and the second ground layer 22 are also composed of an electrically-conductive material, such as copper, silver and gold. The first ground layer 12 and the second ground layer 22 may be composed of different electrically-conductive materials.

The first protection layer 41 and the second protection layer 42 are cover materials, such as coverlay and liquid photosensitive resist. Examples of the material to be used include insulating materials, such as polyimide (PI), polyethylene terephthalate (PET), polyethylene naphthalate (PEN) and polyester (PE).

In the present embodiment, an adhesion layer 30 is interposed between the first substrate 10 and the second substrate 20. The adhesion layer 30 allows adhesion between the one main surface 11a of the first insulating substrate 11 which constitutes the first substrate 10 of the present embodiment and the one main surface 21a of the second insulating substrate 21. The first signal lines 130 are formed on the one main surface 11a of the first insulating substrate 11 while the second signal lines 230 are formed on the one main surface 21a of the second insulating substrate 21.

The adhesion layer 30 of the present embodiment is composed of a material that contains modified polyphenylene ether (referred also to as an "m-PPE," hereinafter). The adhesion layer 30 of the present embodiment is composed of modified polyphenylene ether. The modified polyphenylene ether for use may be appropriately selected from those which are available at the time of filing of the present application.

In the present embodiment, the m-PPE used for the adhesion layer 30 is a material that is obtained, for example, by heating and melting a polyether imide and blending it with a styrene-vinyl-based compound copolymer obtained through copolymerization of a styrene-based compound and a vinyl-based compound so that the material can have melt flowability and high heat resistance. The m-PPE of the adhesive has physical properties of relative permittivity of 2.2 to 2.6 and dielectric tangent of 0.002 to 0.01, for example, at a frequency of 2 GHz, a tensile strength of 30 to 50 MPa, and a tensile elastic modulus of 300 to 400 MPa. In addition, the m-PPE has physical properties of a glass-transition temperature of 230° C. to 250° C. and a thermal expansion coefficient of 100 to 300 ppm/° C.

Although not particularly limited, the m-PPE used in the present embodiment has the physical properties as below:
(a) curing condition of 200° C./1 hr (60 min);
(b) permittivity of 2.4 (2 GHz) [measurement using a cavity resonator];
(c) dielectric tangent of 0.0029 (2 GHz) [measurement using a cavity resonator];
(d) copper peeling strength of 7 (N/cm) [JIS C6471];
(e) tensile strength of 42 (MPa) [JIS C2318];
(f) elongation of 250(%) [JIS C2318];
(g) tensile coefficient of 325 (MPa) [JIS K7113];
(h) glass-transition temperature of 235 (° C.) [DMA (Dynamic Mechanical Analysis): dynamic viscoelastic measurement for detecting elastic modulus, JIS C6481];
(i) thermal expansion coefficient al of no (ppm/° C.) [TMA (Thermal Mechanical Analysis): thermal mechanical analysis for measuring thermal expansion coefficient, JIS C6481];
(j) volume resistance of 1 (E15 Ωcm) [JIS C2170]
(k) thermal resistance of 370 (° C.) [TG-DTA (simultaneous measurement using Thermo Gravimetry Differential Thermal Analyzer)];
(l) water absorption coefficient of less than 0.1(%) [JIS C2318];
(m) chlorine ion of less than 10 (ppm) [measurement by extracting water after 121° C./100% RH/20 hr];
(n) sodium ion of less than 5 (ppm) [measurement by extracting water after 121° C./100% RH/20 hr]; and
(o) potassium ion of less than 5 (ppm) [measurement by extracting water after 121° C./100% RH/20 hr].

The printed wiring board 1 of the present embodiment has a so-called stripline structure. The first insulating substrate 11 is interposed between the first ground layer 12 and the first signal line 131 (130) while the second insulating substrate 21 is interposed between the second ground layer 22 and the second signal line 231 (230). The first signal line 131 (130) is interposed between the first ground layer 12 via the first insulating substrate 11 and the second ground layer 22 via the second insulating substrate 21. The second signal line 231 (230) is interposed between the second ground layer 22 via the second insulating substrate 21 and the first ground layer 12 via the first insulating substrate 11.

Although not illustrated, a so-called coplanar line structure is also possible in which one or more ground lines are formed on the one main surface 11a of the first insulating substrate 11 formed with the first signal line 131 (130) while one or more ground lines are formed on the one main surface 21a of the second insulating substrate 21 formed with the second signal line 231 (230).

A method of manufacturing the printed wiring board 1 of the present embodiment will then be described with reference to FIGS. 2a-2e.

Figure 2:
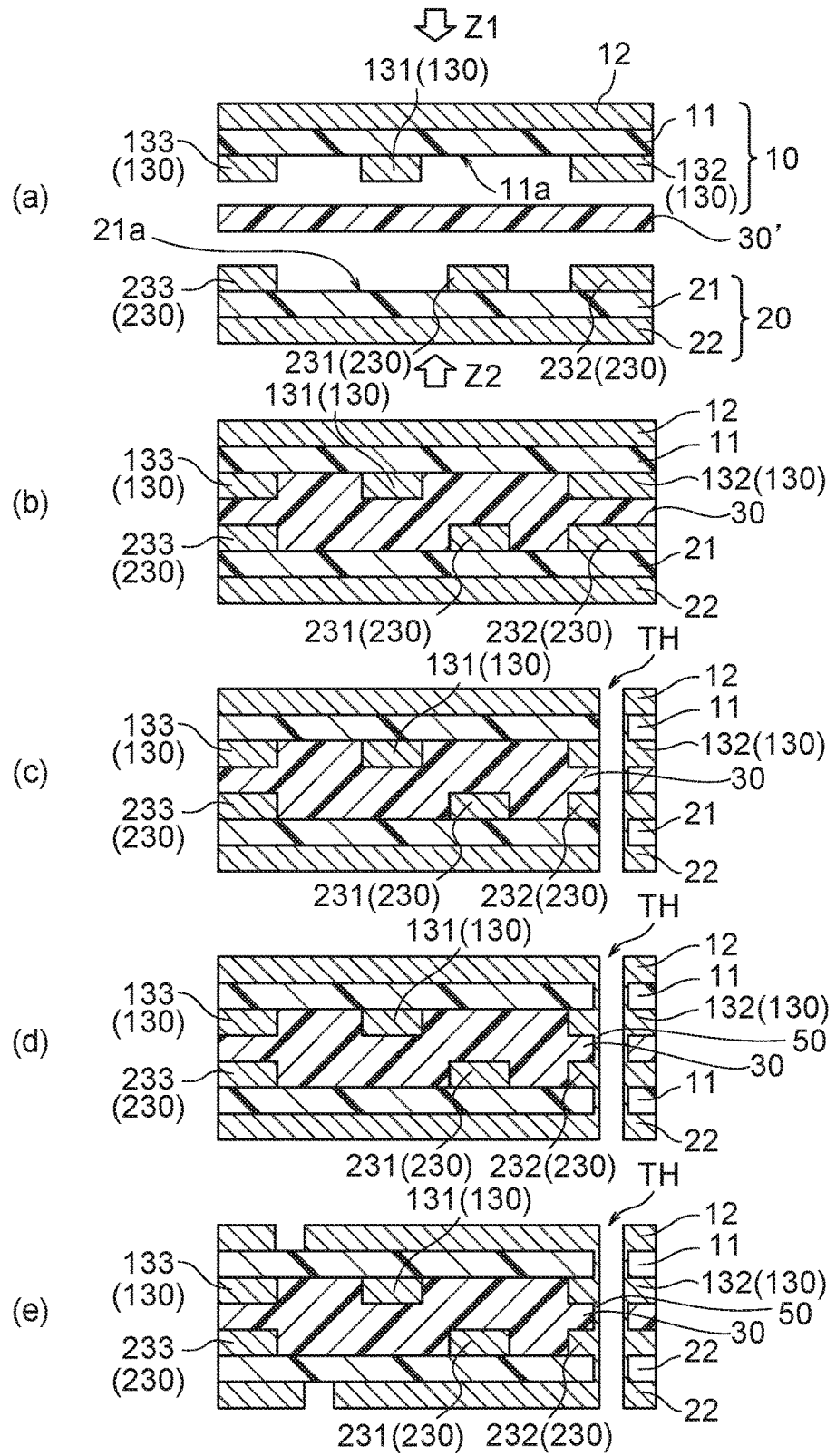
FIGS. 2a-2e are a set of views for describing a method of manufacturing the printed wiring board illustrated in FIG. 1.

First, as illustrated in FIG. 2(a), there are prepared a first substrate 10 formed with first signal lines 130, a second substrate 20 formed with second signal lines 230, and a modified polyphenylene ether resin sheet 30' that constitutes an adhesion layer 30. The first substrate 10 is produced, for example, using a CCL (Copper Clad Laminated) substrate that is configured such that copper foil layers are formed on both main surfaces of a first insulating substrate 11 composed of a liquid crystal polymer and having a thickness of 25 [μm]. Although not particularly limited, the first substrate 10 of the present embodiment has electrolytic copper foil layers having a thickness of 12.5 [μm]. Then, desired first signal lines 130 are formed by etching one or more predetermined regions of the copper foil layer at the side of one main surface 11a of the first insulating substrate 11 using a common photolithography scheme such as a subtractive method. A ground layer 12 is provided as the copper foil layer at the side of the other main surface of the first insulating substrate 11, or may otherwise be formed by etching one or more predetermined regions of the copper foil layer, if necessary.

Similarly, the second substrate 20 is produced, for example, using a CCL (Copper Clad Laminated) substrate that is configured such that copper foil layers are formed on both main surfaces of a second insulating substrate 21 composed of a liquid crystal polymer and having a thickness of 25 [μm]. Although not particularly limited, the second substrate 20 of the present embodiment has electrolytic copper foil layers having a thickness of 12.5 [μm]. Then, desired second signal lines 230 are formed by etching one or more predetermined regions of the copper foil layer at the side of one main surface 21a of the second insulating substrate 21 using a subtractive method as in the first substrate 10. A ground layer 22 is provided as the copper foil layer at the side of the other main surface of the second insulating substrate 21, or may otherwise be formed by etching one or more predetermined regions of the copper foil layer, if necessary.

As illustrated in FIG. 2(a), the modified polyphenylene ether resin sheet 30' is interposed between the first substrate 10 and the second substrate 20. Specifically, the modified polyphenylene ether resin sheet 30' is disposed between the one main surface 11a of the first insulating substrate 11 and the one main surface 21a of the second insulating substrate 21. Then, in the state in which the modified polyphenylene ether resin sheet 30' is interposed between the first substrate 10 and the second substrate 20, laminating press is performed collectively so that they form a laminate in which the first substrate 10 and the second substrate 20 are aligned with each other. Specifically, the first substrate 10 is moved in the direction of arrow Z1 of FIG. 2(a) to come close to the second substrate 20 while the second substrate 20 is moved in the direction of arrow Z2 to come close to the first substrate 10. Then, in a heated situation, thermocompression of the first substrate 10, the modified polyphenylene ether resin sheet 30' and the second substrate 20 is performed along the lamination direction. This operation allows the adhesion layer 30 of modified polyphenylene ether to be formed for adhesion between the one main surface 11a of the first insulating substrate 11 formed with the first signal lines 130 and the one main surface 21a of the second insulating substrate 21 formed with the second signal lines 230 (FIG. 2(b)).

The step of the above thermocompression is performed at a heating temperature of 170° C. to 190° C. and pressurization pressure of 5 to 20 kg/cm² for 30 to 60 minutes under a vacuum atmosphere. Here, the temperature for pressurization curing of the m-PPE of adhesive which constitutes the adhesion layer 30 of the present embodiment is, for example, around 180° C.±10° C. In the present embodiment, the thermocompression is performed under the press condition of a heating temperature of 180° C.±10° C. and time of about 30 to 60 minutes in a vacuum atmosphere. This allows polymers of the m-PPE, which constitute the adhesion layer 30, to be alloyed, and the adhesion layer 30 thereby exhibits properties including high heat resistance and flexibility. Thus, a flexible printed wiring board 1 can be obtained because the adhesion layer 30 of the present embodiment has flexibility. The glass-transition temperature of the first insulating substrate 11 and second insulating substrate 21 of the present embodiment is, for example, 300° C. or higher. The temperature for pressurization curing of the adhesion layer 30 is lower than the glass-transition temperature (300° C. or higher) of the first insulating substrate 11/second insulating substrate 21. According to this fact, damage can be suppressed to minimum, such as deformation caused in the first insulating substrate 11 and second insulating substrate 21 during the thermocompression step.

Moreover, the thermocompression step of the present embodiment does not need a heat pressing process at high temperature, and therefore the printed wiring board 1 according to embodiments of the present invention can be produced using manufacturing facilities for existing FPCs which use a polyimide-based resin as materials for insulating substrates. The production cost for the printed wiring board 1 can thus be reduced because, in the thermocompression step of the present embodiment, a low-cost pressing machine can be used, such as steam heating-type and heated solvent overheating oil-type, for example.

Subsequently, as illustrated in FIG. 2(c), through-holes TH having a predetermined diameter are formed to pass through the first substrate 10 and the second substrate 20. Scheme of forming the through-holes TH is not limited, and they may be opened using an NC drill or opened by laser processing.

Thereafter, as illustrated in FIG. 2(d), after direct plating process is performed for the first substrate 10 and the second substrate 20, a plating process is performed for the through-holes TH. This plating process forms interlayer conducting layers 50. The interlayer conducting layers 50 electrically connect some of the first signal lines 130, some of the second signal lines 230, the first ground layer 12, and the second ground layer 22 with one another for interlayer conduction.

Then, as illustrated in FIG. 2(e), necessary circuits are formed using the first ground layer 12 and the second ground layer 22.

As illustrated in FIG. 1, a first protection layer 41 covering the first ground layer 12 and a second protection layer 42 covering the second ground layer 22 are formed and the printed wiring board 1 illustrated in FIG. 1 is thus obtained. In practical use, a reference potential (such as power source potential and ground potential) is applied to the first ground layer 12 and the second ground layer 22, so the first signal line 132 and second signal line 232 as illustrated are also at the reference potential.

Although illustration is omitted, in the present embodiment, one or more coaxial connectors are mounted on a surface or surfaces of the printed wiring board 1. In the present embodiment, input and output of signals are achieved via the coaxial connectors, which are surface-mounted on the printed wiring board 1. Since the coaxial connectors can be mounted using a conventional mounting line, the printed wiring board 1 according to the present embodiment can be produced without introducing new facilities. Moreover, using such surface-mounted connectors for input and output of signals allows easy attaching and detaching of components. Even when the installation space is reduced due to a reduced size of products, the products can be efficiently assembled. As a result, the number of operations and the process cost can be actually reduced.

As will be understood, a branching the outer shape of the printed wiring board 1 allows patterning in all directions to improve the degree of freedom in designing. The dimensional accuracy can be maintained high because the outer shape machining for the printed wiring board 1 can be performed using a mold or laser.

In the printed wiring board 1 of the present embodiment, the first insulating substrate 11 and the second insulating substrate 21 are composed of LCP while the adhesion layer 30 is composed of m-PPE, and the permittivity and dielectric tangent can thereby be suppressed at low values. This allows a structure to be realized which is excellent in the high-frequency characteristics compared with those using a conventional polyimide-based resin or the like and which can transmit signals at a high speed without diminishing the flexibility.

In the printed wiring board 1 of the present embodiment, the first and second insulating substrates 11 and 21 composed of a liquid crystal polymer and the adhesion layer 30 of modified polyphenylene ether are combined to allow suppression of the permittivity to a low value and allow realization of high-speed transmission at high frequencies. Moreover, one printed wiring board 1 can transmit signals of two or more different frequencies because a plurality of independent signal lines can be wired inside the adhesion layer 30 which constitutes a multilayer substrate.

Furthermore, in the printed wiring board 1 of the present embodiment, the first signal line 131 (130) and the second signal line 231 (230) are disposed at positions that are shifted in the circuit width direction so as to ensure the distance between the first signal line 131 (130) and the second ground layer 22 and the distance between the second signal line 231 (230) and the first ground layer 12, and the signals can therefore be transmitted without interference between the signal lines. This allows highly reliable signal transmission to be carried out in any of the first signal line 131 (130) and the second signal line 231 (230). The transmission characteristics can be maintained at a high level because the circuit width of each signal line can be designed wide even when matching the characteristic impedance of each signal line. In addition, the flexibility and bending property are not diminished because the thickness of the printed wiring board 1 is allowed not to be unduly thick.

<Examples>

Hereinafter, examples in the present embodiment of this invention will be described. These examples described below are for verifying the transmission characteristics such as crosstalk of the printed wiring board 1 of the present embodiment.

Figure 3:
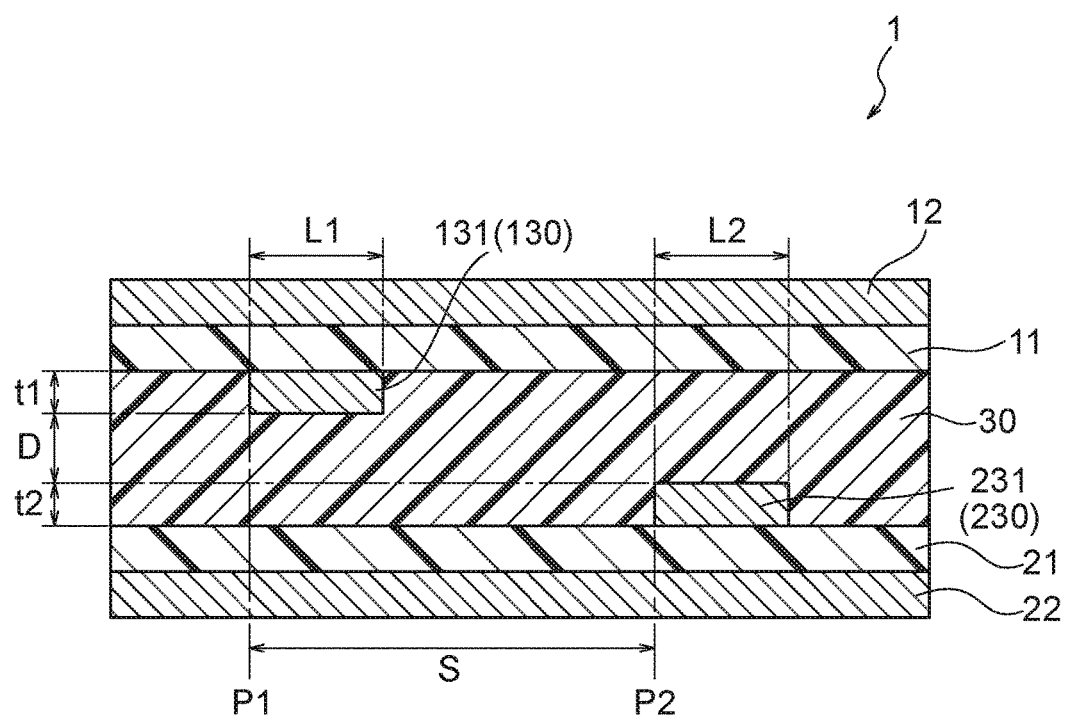
FIG. 3 is a view for describing the structure of a printed wiring board according to examples of the embodiment.

Printed wiring boards 1 having a certain form illustrated in FIG. 3, were obtained as the examples. As illustrated in FIG. 3, each of the printed wiring boards 1 according to these examples has one first signal line 131 and one second signal line 231. The line width of the first signal line 131 is defined as a circuit width L1 and the line width of the second signal line 231 is defined as a circuit width L2. For the sake of convenience in experiments, the circuit width L1 of the first signal line 131 and the circuit width L2 of the second signal line 231 have a common value. The thickness of the first signal line 131 along the lamination direction of a first substrate 10 and a second substrate 20 is defined as a thickness t1 and the thickness of the second signal line 231 along the lamination direction is defined as a thickness t2. For the sake of convenience in experiments, the thickness t1 of the first signal line 131 and the thickness t2 of the second signal line 231 are the same thickness.

An offset amount S is defined as the distance from a position P1 of one end farthest from the second signal line 231 among both ends of the first signal line 131 along the width direction of the first signal line 131 to a position P2 of one end nearest to the first signal line 131 among both ends of the second signal line 231 along the width direction of the second signal line 231. A distance between conductors D is defined as the distance between the position of a plane (plane that is not in contact with a first insulating substrate 11) of the first signal line 131 along the main surface of the first insulating substrate 11 and the position of a plane (plane that is not in contact with a second insulating substrate 21) of the second signal line 231 along the main surface of the second insulating substrate 21.

Structure 1, Structure 2, Structure 3, and Structure 4 are defined as listed in Table 1 below, in which the printed wiring boards 1 of the present examples have the basic structure illustrated in FIG. 3, but the designed value of the circuit width L is changed to 25 [μm], 50 [μm] or 100 [μm] and the designed value of the distance between conductors D is changed to 30 [μm] or 60 [μm].

TABLE 1

|  | Structure V | | | |
|---|---|---|---|---|
|  | Structure 1 | Structure 2 | Structure 3 | Structure 4 |
| Circuit width L [μm] | 100 | 50 | 25 | 100 |
| Distance between conductors D [μm] | 30 | 30 | 30 | 60 |

In addition, printed wiring boards 1' were produced as comparative examples, each with a first insulating substrate 11' (having a comparative structure, here and hereinafter) and second insulating substrate 21' (having a comparative structure, here and hereinafter) composed of polyimide and an adhesion layer 30' (having a comparative structure, here and hereinafter) composed of acrylic epoxy-based adhesive (permittivity of 3.6 to 3.8 (2 GHz), dielectric tangent of 0.03 to 0.04, copper peeling strength of 9 N/cm, and water absorption coefficient of 2.0%). These printed wiring boards 1' according to the comparative examples are also provided with Structure 1, Structure 2, Structure 3, and Structure 4 of the above Table 1 as in the present examples.

Table 2 lists the physical property values of an LCP film used in the first insulating substrate 11 and second insulating substrate 21 of each of the present examples and a PI film used in the first insulating substrate 11' and second insulating substrate 21' of each of the comparative examples.

TABLE 2

| Item | Unit | LCP film | PI film |
|---|---|---|---|
| Tensile strength | MPa | 240 | 350 |
| Fracture strength | % | 2 | 85 |
| Tensile elastic modulus | GPa | 2 | 3.50 |
| Thermal expansion coefficient | $10^{-6}$/° C. | 18 | 27 |
| Melting point | ° C. | 280 | None |
| Permittivity |  | 2.9 | 3.3 |
| Dielectric tangent |  | 0.002 | 0.001 |
| Water absorption coefficient | % | 0.04 | 2.9 |

The m-PPE resin film used in the adhesion layer 30 of each of the present examples has a permittivity of 2.2 to 2.6 (2 GHz), dielectric tangent of 0.002 to 0.01, copper peeling strength of 7 N/cm, and water absorption coefficient of 0.2%. The pressing can be performed at a temperature of around 180° C.±10° C. in the laminating step when producing a multilayer substrate because the m-PPE resin film constitutes the adhesion layer 30. The process at such a relatively low temperature allows the printed wiring board to be manufactured using an existing apparatus for manufacturing flexible printed boards. Moreover, the variation in size of the produced printed wiring boards 1 can be suppressed because the process is possible at relatively low temperatures.

In addition, the m-PPE resin film is soft and can thus be embedded with circuits even by a low pressure (0.1 to 1 MPa), and therefore one-time laminating process can be carried out. Using the m-PPE resin film of such a material quality as the adhesion layer 30 can reduce the number of steps required for manufacturing and can also reduce subsidiary materials used when performing the laminating press. The m-PPE resin film has moisture absorption resistance. Moreover, interposition of the m-PPE resin film improves the transmission characteristics because of its low permittivity.

Then, for the examples provided with Structures 1 to 4 and the comparative examples provided with Structures 1 to 4, the crosstalk S41 [dB] when changing the offset amount S at each frequency was measured and compared. The crosstalk S41 [dB] measured in the present embodiment is a measured value that is indicative of a degree that the transmitted signal in one signal line (transmission path) of a plurality of signal lines leaks into another signal line (transmission path). In the present embodiment, an example with a lower value of the crosstalk S41 is evaluated as having a less amount of signal leak and as exhibiting better transmission characteristics.

Table 3 below lists the measurement results of the crosstalk S41 [dB] in Examples 1-1 to 1-4 and Comparative Examples 1-1 to 1-4 when changing the offset amount S at a frequency of transmitted signals of 700 MHz. Example 1-1 and Comparative Example 1-1 are provided with Structure 1, Example 1-2 and Comparative Example 1-2 are provided with Structure 2, Example 1-3 and Comparative Example 1-3 are provided with Structure 3, and Example 1-4 and Comparative Example 1-4 are provided with Structure 4.

TABLE 3

Test Results of Crosstalk S41 at 700 MHz

| Material | Designed value [μm] | | Offset amount S [μm] | | | | | |
|---|---|---|---|---|---|---|---|---|
| | L | D | 0 | 100 | 200 | 300 | 400 | 500 |
| Example 1-1 | 100 | 30 | 0.273 | 0.196 | 0.074 | 0.032 | 0.014 | 0.006 |
| Comparative Example 1-1 | 100 | 30 | 0.338 | 0.244 | 0.101 | 0.047 | 0.022 | 0.010 |
| Example 1-2 | 50 | 30 | 0.192 | 0.102 | 0.047 | 0.021 | 0.009 | 0.004 |
| Comparative Example 1-2 | 50 | 30 | 0.244 | 0.141 | 0.068 | 0.033 | 0.015 | 0.007 |
| Example 1-3 | 25 | 30 | 0.140 | 0.076 | 0.036 | 0.016 | 0.007 | 0.003 |
| Comparative Example 1-3 | 25 | 30 | 0.186 | 0.107 | 0.054 | 0.026 | 0.012 | 0.006 |
| Example 1-4 | 100 | 60 | 0.220 | 0.171 | 0.098 | 0.055 | 0.030 | 0.017 |
| Comparative Example 1-4 | 100 | 60 | 0.269 | 0.218 | 0.132 | 0.077 | 0.045 | 0.026 |

Figure 4A:
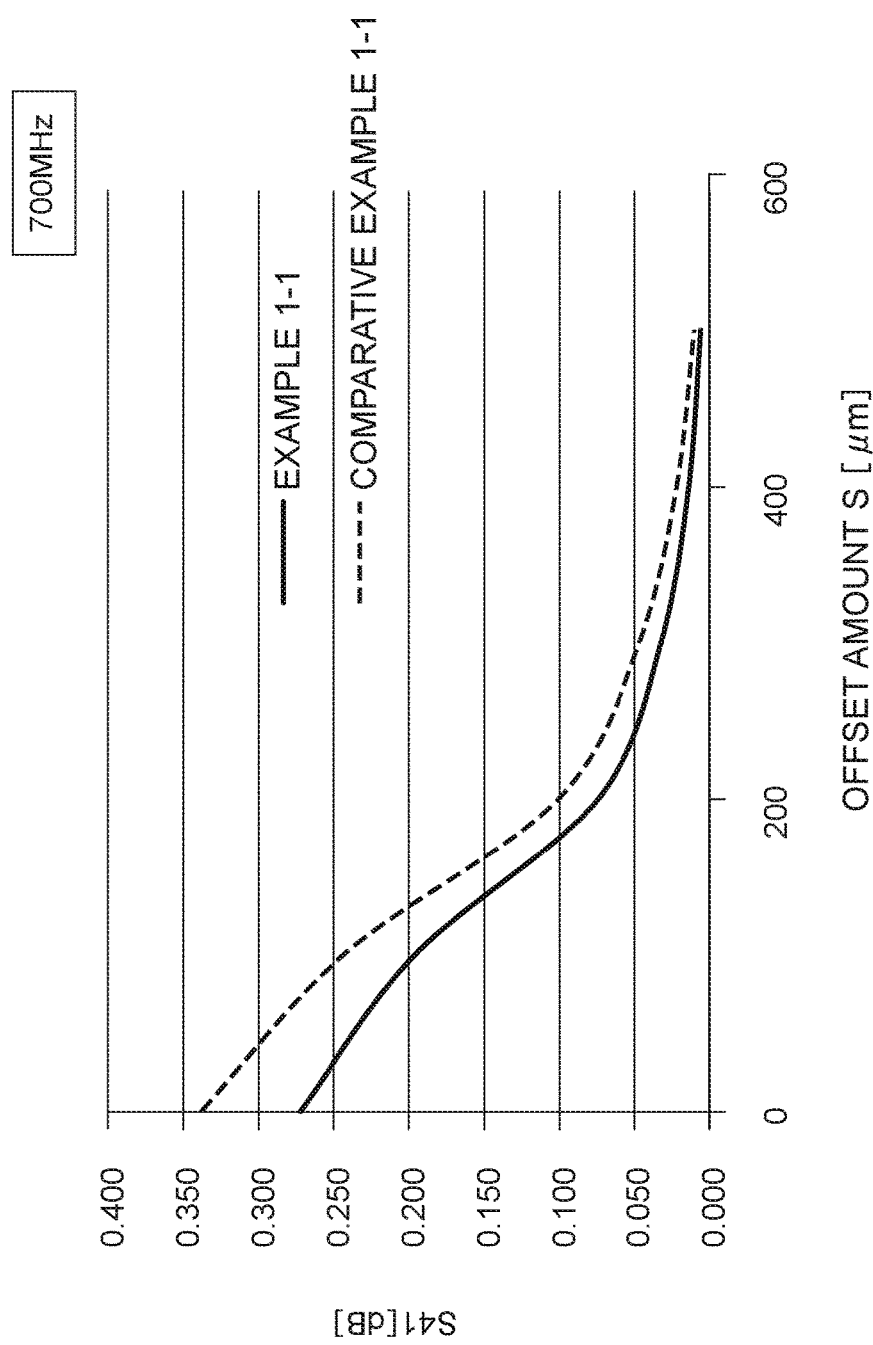
FIG. 4A is a graph illustrating measurement results of crosstalk S41 at a frequency of 700 MHz when the offset amount S is varied in Structure 1 where circuit width L is 100 μm and distance between conductors D is 30 μm in a structure shown in FIG. 3.
Figure 4D:
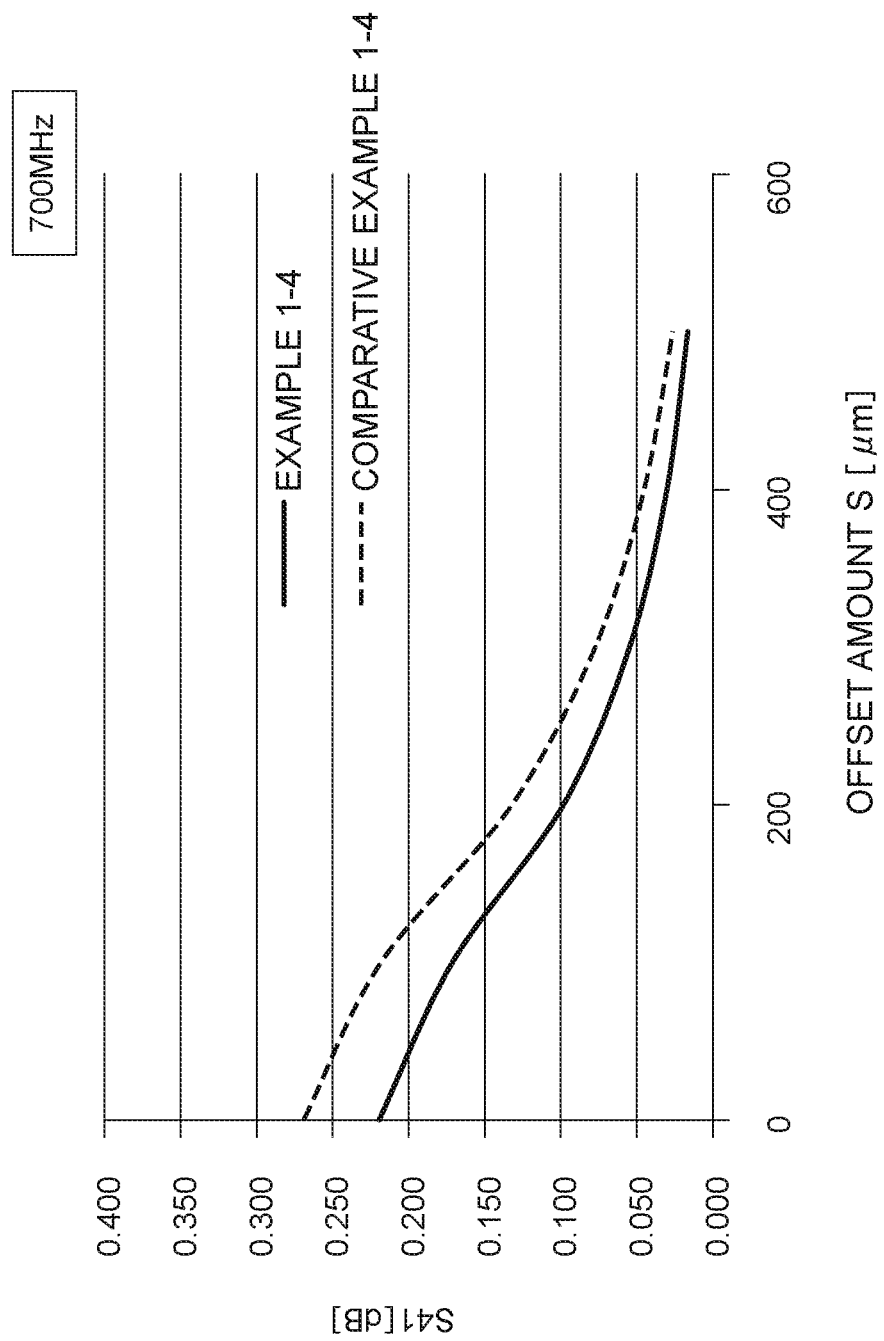
FIG. 4D is a graph illustrating measurement results of crosstalk S41 at a frequency of 700 MHz when the offset amount S is varied in Structure 4 where circuit width L is 100 μm and distance between conductors D is 60 μm in a structure shown in FIG. 3.

FIG. 4A illustrates the measurement results of the crosstalk S41 to the offset amount in Example 1-1 and Comparative Example 1-1 which are provided with Structure 1. FIG. 4B illustrates the measurement results of the crosstalk S41 to the offset amount in Example 1-2 and Comparative Example 1-2 which are provided with Structure 2. FIG. 4C illustrates the measurement results of the crosstalk S41 to the offset amount in Example 1-3 and Comparative Example 1-3 which are provided with Structure 3. FIG. 4D illustrates the measurement results of the crosstalk S41 to the offset amount in Example 1-4 and Comparative Example 1-4 which are provided with Structure 4. Solid lines represent the examples and broken lines represent the comparative examples.

Table 4 below lists the measurement results of the crosstalk S41 [dB] in Examples 2-1 to 2-4 and Comparative Examples 2-1 to 2-4 when changing the offset amount S at a frequency of transmitted signals of 800 MHz. Example 2-1 and Comparative Example 2-1 are provided with Structure 1. Example 2-2 and Comparative Example 2-2 are provided with Structure 2, Example 2-3 and Comparative Example 2-3 are provided with Structure 3, and Example 2-4 and Comparative Example 2-4 are provided with Structure 4. These measurement results exhibit the same tendencies as those at 700 MHz, so the illustration is omitted.

TABLE 4

Test Results of Crosstalk S41 at 800 MHz

| Material | Designed value [μm] | | Offset amount S [μm] | | | | | |
|---|---|---|---|---|---|---|---|---|
| | L | D | 0 | 100 | 200 | 300 | 400 | 500 |
| Example 2-1 | 100 | 30 | 0.284 | 0.213 | 0.084 | 0.037 | 0.016 | 0.007 |
| Comparative Example 2-1 | 100 | 30 | 0.342 | 0.260 | 0.114 | 0.053 | 0.025 | 0.012 |
| Example 2-2 | 50 | 30 | 0.210 | 0.120 | 0.055 | 0.025 | 0.011 | 0.005 |
| Comparative Example 2-2 | 50 | 30 | 0.261 | 0.163 | 0.079 | 0.038 | 0.018 | 0.008 |
| Example 2-3 | 25 | 30 | 0.168 | 0.092 | 0.043 | 0.019 | 0.008 | 0.003 |
| Comparative Example 2-3 | 25 | 30 | 0.216 | 0.128 | 0.063 | 0.030 | 0.014 | 0.007 |
| Example 2-4 | 100 | 60 | 0.236 | 0.189 | 0.111 | 0.062 | 0.035 | 0.019 |
| Comparative Example 2-4 | 100 | 60 | 0.284 | 0.237 | 0.148 | 0.087 | 0.051 | 0.030 |

Table 5 below lists the measurement results of the crosstalk S41 [dB] in Examples 3-1 to 3-4 and Comparative Examples 3-1 to 3-4 when changing the offset amount S at a frequency of transmitted signals of 900 MHz. Example 3-1 and Comparative Example 3-1 are provided with Structure 1, Example 3-2 and Comparative Example 3-2 are provided with Structure 2, Example 3-3 and Comparative Example 3-3 are provided with Structure 3, and Example 3-4 and Comparative Example 3-4 are provided with Structure 4. These measurement results exhibit the same tendencies as those at 700 MHz, so the illustration is omitted.

TABLE 5

Test Results of Crosstalk S41 at 900 MHz

| Material | Designed value [μm] | | Offset amount S [μm] | | | | | |
|---|---|---|---|---|---|---|---|---|
| | L | D | 0 | 100 | 200 | 300 | 400 | 500 |
| Example 3-1 | 100 | 30 | 0.292 | 0.228 | 0.095 | 0.041 | 0.018 | 0.008 |
| Comparative Example 3-1 | 100 | 30 | 0.345 | 0.274 | 0.126 | 0.059 | 0.028 | 0.013 |

TABLE 5-continued

Test Results of Crosstalk S41 at 900 MHz

| Material | Designed value [μm] | | Offset amount S [μm] | | | | | |
|---|---|---|---|---|---|---|---|---|
| | L | D | 0 | 100 | 200 | 300 | 400 | 500 |
| Example 3-2 | 50 | 30 | 0.228 | 0.138 | 0.064 | 0.028 | 0.012 | 0.005 |
| Comparative Example 3-2 | 50 | 30 | 0.278 | 0.184 | 0.091 | 0.043 | 0.020 | 0.010 |
| Example 3-3 | 25 | 30 | 0.197 | 0.109 | 0.050 | 0.022 | 0.009 | 0.004 |
| Comparative Example 3-3 | 25 | 30 | 0.248 | 0.150 | 0.073 | 0.035 | 0.016 | 0.008 |
| Example 3-4 | 100 | 60 | 0.251 | 0.205 | 0.124 | 0.070 | 0.039 | 0.021 |
| Comparative Example 3-4 | 100 | 60 | 0.298 | 0.253 | 0.162 | 0.097 | 0.057 | 0.033 |

Table 6 below lists the measurement results of the crosstalk S41 [dB] in Examples 4-1 to 4-4 and Comparative Examples 4-1 to 4-4 when changing the offset amount S at a frequency of transmitted signals of 1.5 GHz. Example 4-1 and Comparative Example 4-1 are provided with Structure 1, Example 4-2 and Comparative Example 4-2 are provided with Structure 2, Example 4-3 and Comparative Example 4-3 are provided with Structure 3, and Example 4-4 and Comparative Example 4-4 are provided with Structure 4. These measurement results exhibit the same tendencies as those at 700 MHz, so the illustration is omitted.

TABLE 6

Test Results of Crosstalk S41 at 1.5 GHz

| Material | Designed value [μm] | | Offset amount S [μm] | | | | | |
|---|---|---|---|---|---|---|---|---|
| | L | D | 0 | 100 | 200 | 300 | 400 | 500 |
| Example 4-1 | 100 | 30 | 0.365 | 0.312 | 0.154 | 0.069 | 0.030 | 0.013 |
| Comparative Example 4-1 | 100 | 30 | 0.508 | 0.371 | 0.197 | 0.096 | 0.045 | 0.021 |
| Example 4-2 | 50 | 30 | 0.391 | 0.258 | 0.121 | 0.053 | 0.023 | 0.010 |
| Comparative Example 4-2 | 50 | 30 | 0.495 | 0.325 | 0.166 | 0.080 | 0.038 | 0.018 |
| Example 4-3 | 25 | 30 | 0.383 | 0.223 | 0.100 | 0.043 | 0.018 | 0.008 |
| Comparative Example 4-3 | 25 | 30 | 0.469 | 0.293 | 0.145 | 0.069 | 0.032 | 0.015 |
| Example 4-4 | 100 | 60 | 0.351 | 0.301 | 0.197 | 0.114 | 0.064 | 0.035 |
| Comparative Example 4-4 | 100 | 60 | 0.430 | 0.364 | 0.247 | 0.152 | 0.090 | 0.053 |

Table 7 below lists the measurement results of the crosstalk S41 [dB] in Examples 5-1 to 5-4 and Comparative Examples 5-1 to 5-4 when changing the offset amount S at a frequency of transmitted signals of 1.7 GHz. Example 5-1 and Comparative Example 5-1 are provided with Structure 1, Example 5-2 and Comparative Example 5-2 are provided with Structure 2, Example 5-3 and Comparative Example 5-3 are provided with Structure 3, and Example 5-4 and Comparative Example 5-4 are provided with Structure 4. These measurement results exhibit the same tendencies as those at 700 MHz, so the illustration is omitted.

TABLE 7

Test Results of Crosstalk S41 at 1.7 GHz

| Material | Designed value [μm] | | Offset amount S [μm] | | | | | |
|---|---|---|---|---|---|---|---|---|
| | L | D | 0 | 100 | 200 | 300 | 400 | 500 |
| Example 5-1 | 100 | 30 | 0.440 | 0.353 | 0.174 | 0.078 | 0.034 | 0.014 |
| Comparative Example 5-1 | 100 | 30 | 0.695 | 0.435 | 0.221 | 0.108 | 0.051 | 0.024 |
| Example 5-2 | 50 | 30 | 0.474 | 0.301 | 0.141 | 0.062 | 0.027 | 0.011 |
| Comparative Example 5-2 | 50 | 30 | 0.606 | 0.376 | 0.192 | 0.093 | 0.044 | 0.020 |
| Example 5-3 | 25 | 30 | 0.447 | 0.265 | 0.120 | 0.052 | 0.022 | 0.009 |
| Comparative Example 5-3 | 25 | 30 | 0.548 | 0.344 | 0.173 | 0.082 | 0.039 | 0.018 |
| Example 5-4 | 100 | 60 | 0.410 | 0.343 | 0.222 | 0.129 | 0.072 | 0.040 |
| Comparative Example 5-4 | 100 | 60 | 0.527 | 0.425 | 0.278 | 0.171 | 0.102 | 0.060 |

Table 8 below lists the measurement results of the crosstalk S41 [dB] in Examples 6-1 to 6-4 and Comparative Examples 6-1 to 6-4 when changing the offset amount S at a frequency of transmitted signals of 2.0 GHz. Example 6-1 and Comparative Example 6-1 are provided with Structure 1, Example 6-2 and Comparative Example 6-2 are provided with Structure 2, Example 6-3 and Comparative Example 6-3 are provided with Structure 3, and Example 6-4 and Comparative Example 6-4 are provided with Structure 4. These measurement results exhibit the same tendencies as those at 700 MHz, so the illustration is omitted.

TABLE 8

Test Results of Crosstalk S41 at 2.0 GHz

| Material | Designed value [μm] | | Offset amount S [μm] | | | | | |
|---|---|---|---|---|---|---|---|---|
| | L | D | 0 | 100 | 200 | 300 | 400 | 500 |
| Example 6-1 | 100 | 30 | 0.611 | 0.438 | 0.204 | 0.092 | 0.040 | 0.017 |
| Comparative Example 6-1 | 100 | 30 | 0.775 | 0.563 | 0.259 | 0.126 | 0.060 | 0.028 |
| Example 6-2 | 50 | 30 | 0.601 | 0.364 | 0.173 | 0.076 | 0.033 | 0.014 |
| Comparative Example 6-2 | 50 | 30 | 0.716 | 0.451 | 0.232 | 0.112 | 0.053 | 0.025 |
| Example 6-3 | 25 | 30 | 0.691 | 0.436 | 0.216 | 0.096 | 0.041 | 0.018 |
| Comparative Example 6-3 | 25 | 30 | 0.654 | 0.419 | 0.218 | 0.105 | 0.049 | 0.023 |
| Example 6-4 | 100 | 60 | 0.526 | 0.419 | 0.262 | 0.152 | 0.085 | 0.046 |
| Comparative Example 6-4 | 100 | 60 | 0.672 | 0.534 | 0.332 | 0.201 | 0.119 | 0.070 |

Table 9 below lists the measurement results of the crosstalk S41 [dB] in Examples 7-1 to 7-4 and Comparative Examples 7-1 to 7-4 when changing the offset amount S at a frequency of transmitted signals of 2.5 GHz. Example 7-1 and Comparative Example 7-1 are provided with Structure 1, Example 7-2 and Comparative Example 7-2 are provided with Structure 2, Example 7-3 and Comparative Example 7-3 are provided with Structure 3, and Example 7-4 and Comparative Example 7-4 are provided with Structure 4.

TABLE 9

Test Results of Crosstalk S41 at 2.5 GHz

| Material | Designed value [μm] L | D | Offset amount S [μm] 0 | 100 | 200 | 300 | 400 | 500 |
|---|---|---|---|---|---|---|---|---|
| Example 7-1 | 100 | 30 | 0.739 | 0.598 | 0.257 | 0.115 | 0.050 | 0.021 |
| Comparative Example 7-1 | 100 | 30 | 0.724 | 0.708 | 0.330 | 0.158 | 0.075 | 0.035 |
| Example 7-2 | 50 | 30 | 0.728 | 0.466 | 0.225 | 0.100 | 0.043 | 0.018 |
| Comparative Example 7-2 | 50 | 30 | 0.777 | 0.569 | 0.293 | 0.143 | 0.067 | 0.032 |
| Example 7-3 | 25 | 30 | 0.691 | 0.436 | 0.216 | 0.096 | 0.041 | 0.018 |
| Comparative Example 7-3 | 75 | 30 | 0.792 | 0.532 | 0.285 | 0.139 | 0.066 | 0.031 |
| Example 7-4 | 100 | 60 | 0.677 | 0.552 | 0.333 | 0.190 | 0.106 | 0.058 |
| Comparative Example 7-4 | 100 | 60 | 0.745 | 0.665 | 0.428 | 0.256 | 0.151 | 0.089 |

Figure 5A:
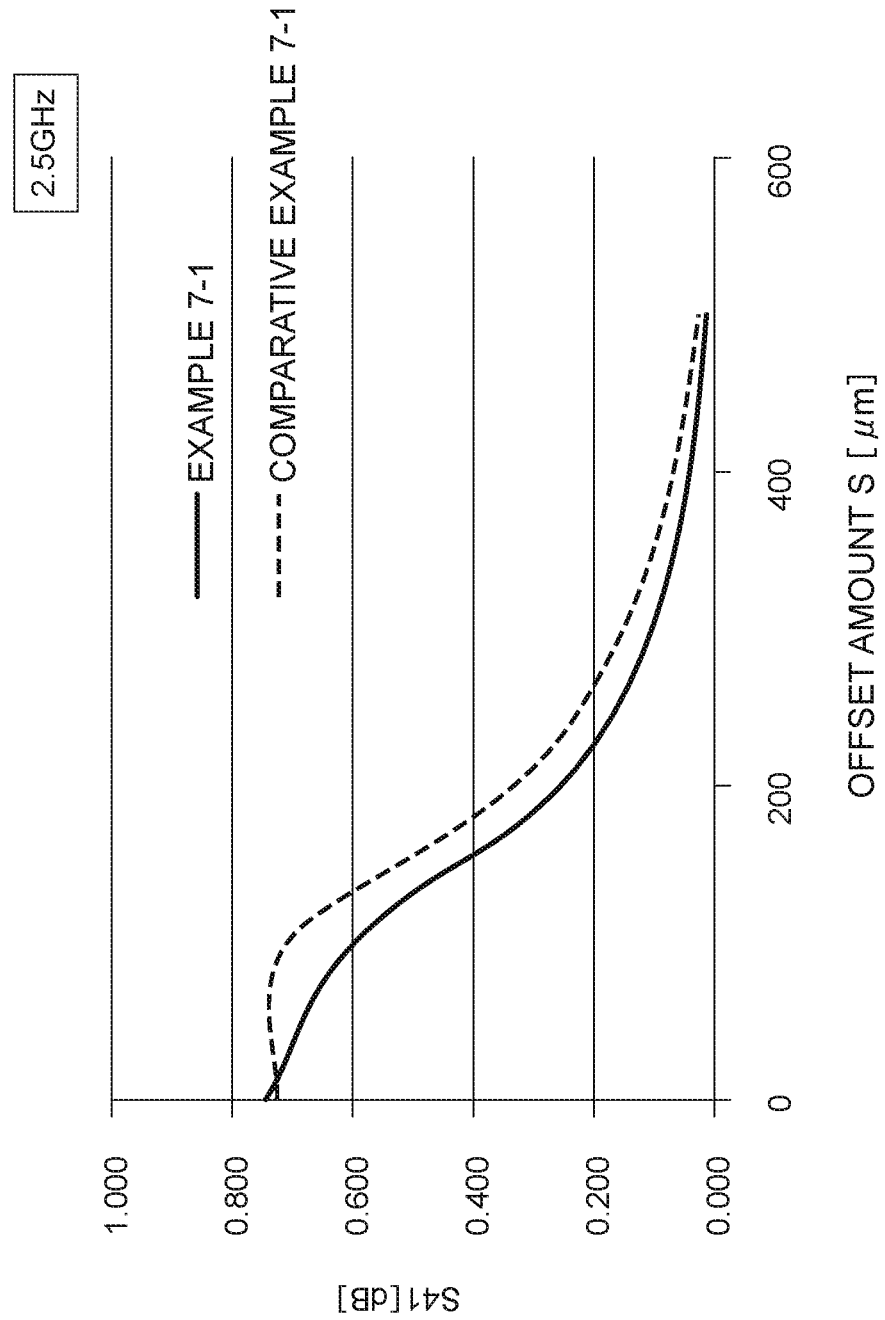
FIG. 5A is a graph illustrating measurement results of crosstalk S41 at a frequency of 2.5 GHz when the offset amount S is varied in Structure 1.
Figure 5B:
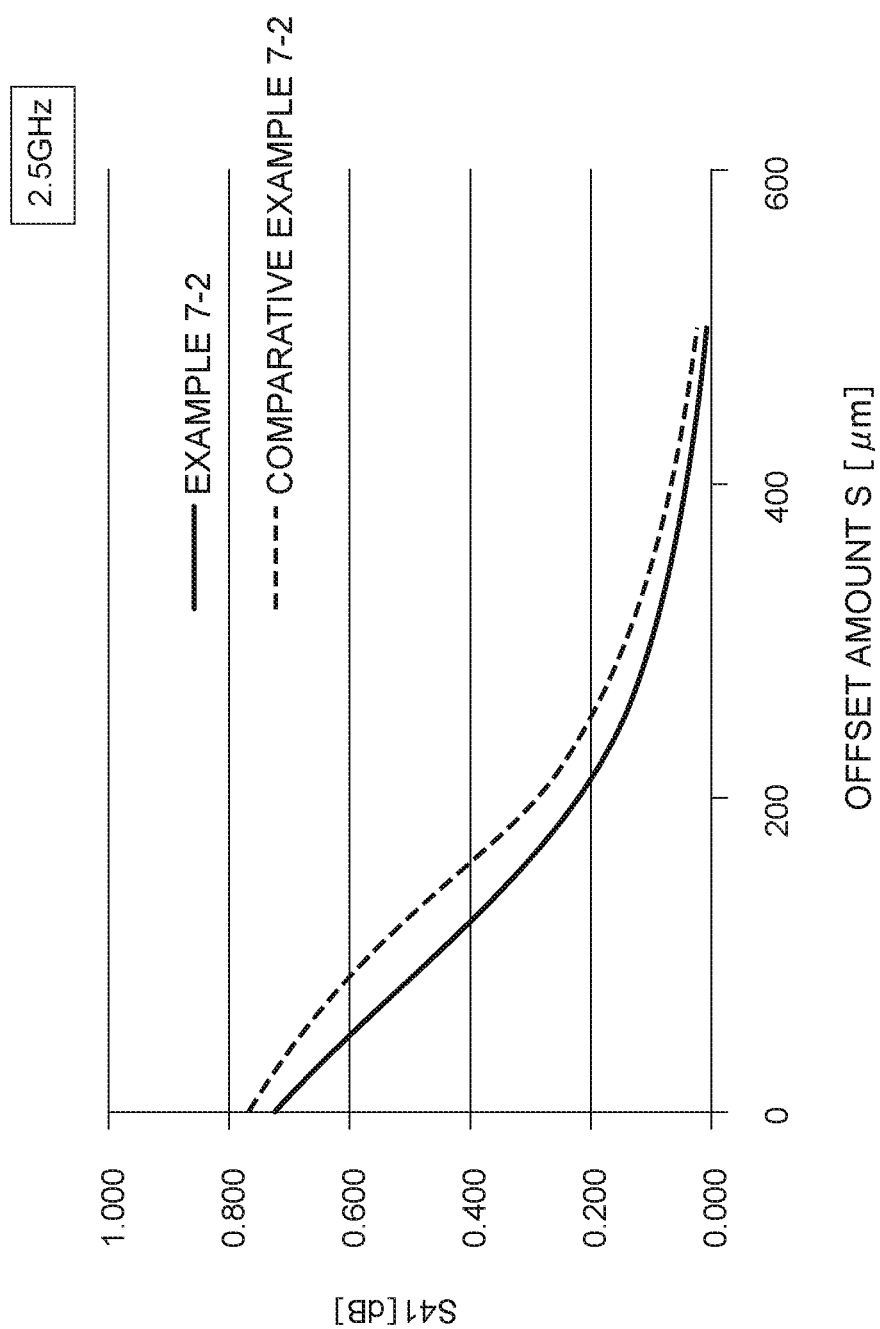
FIG. 5B is a graph illustrating measurement results of crosstalk S41 at a frequency of 2.5 GHz when the offset amount S is varied in Structure 2.
Figure 5C:
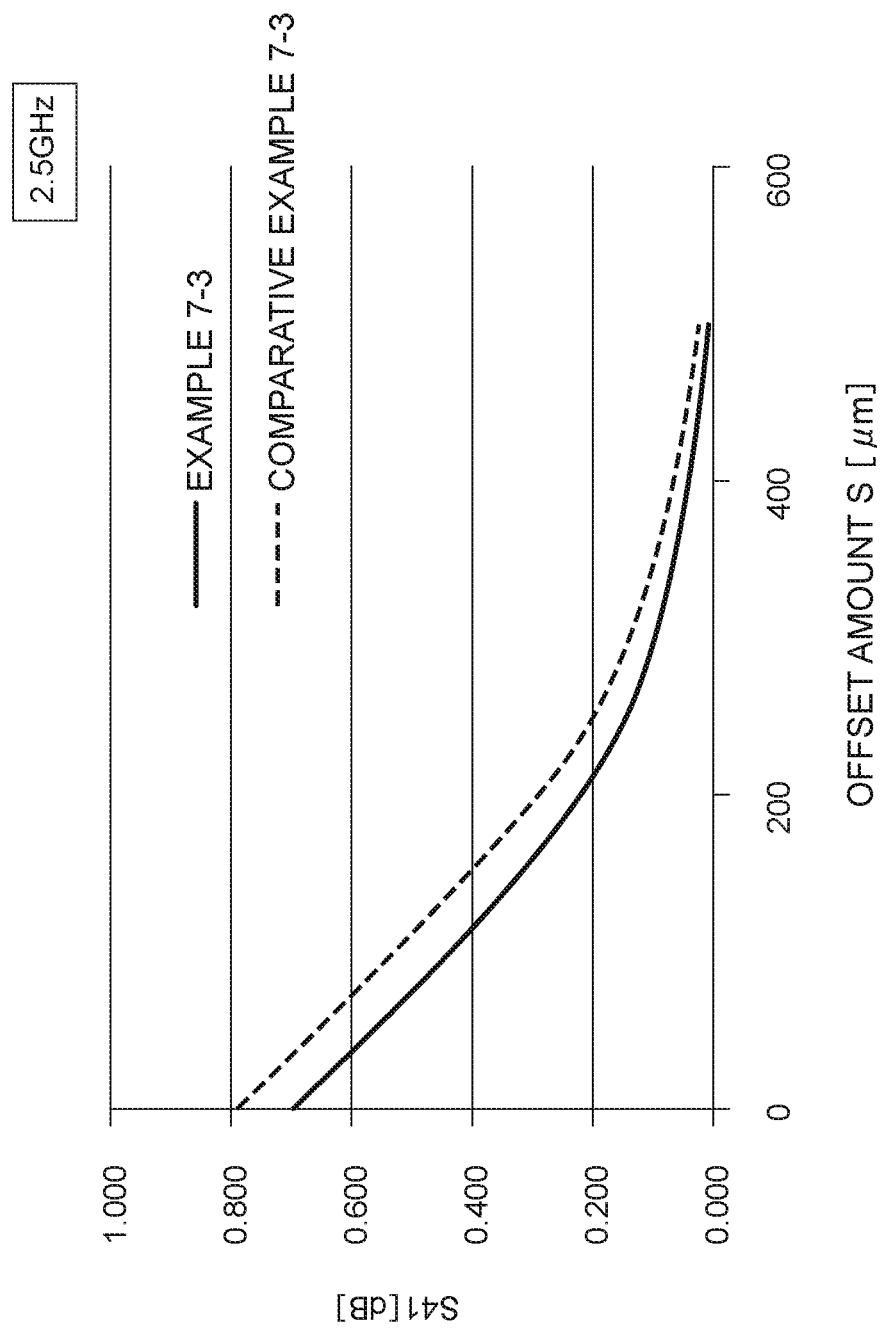
FIG. 5C is a graph illustrating measurement results of crosstalk S41 at a frequency of 2.5 GHz when the offset amount S is varied in Structure 3.

FIG. 5A illustrates the measurement results of the crosstalk S41 to the offset amount in Example 7-1 and Comparative Example 7-1 which are provided with Structure 1. FIG. 5B illustrates the measurement results of the crosstalk S41 to the offset amount in Example 7-2 and Comparative Example 7-2 which are provided with Structure 2. FIG. 5C illustrates the measurement results of the crosstalk S41 to the offset amount in Example 7-3 and Comparative Example 7-3 which are provided with Structure 3. FIG. 5D illustrates the measurement results of the crosstalk S41 to the offset amount in Example 7-4 and Comparative Example 7-4 which are provided with Structure 4. Solid lines represent the examples and broken lines represent the comparative examples. As illustrated in FIG. 5A to FIG. 5D, the patterns of crosstalk S41 at a frequency of transmitted signals of 2.5 GHz are approximately the same as those at 700 MHz to 2.0 GHz.

Table 10 below lists the measurement results of the crosstalk S41 [dB] in Examples 8-1 to 8-4 and Comparative Examples 8-1 to 8-4 when changing the offset amount S at a frequency of transmitted signals of 5.0 GHz. Example 8-1 and Comparative Example 8-1 are provided with Structure 1, Example 8-2 and Comparative Example 8-2 are provided with Structure 2, Example 8-3 and Comparative Example 8-3 are provided with Structure 3, and Example 8-4 and Comparative Example 8-4 are provided with Structure 4.

TABLE 10

Test Results of Crosstalk S41 at 5 GHz

| Material | Designed value [μm] L | D | Offset amount S [μm] 0 | 100 | 200 | 300 | 400 | 500 |
|---|---|---|---|---|---|---|---|---|
| Example 8-1 | 100 | 30 | 0.812 | 0.929 | 0.493 | 0.228 | 0.099 | 0.042 |
| Comparative Example 8-1 | 100 | 30 | 0.691 | 0.896 | 0.621 | 0.313 | 0.150 | 0.071 |
| Example 8-2 | 50 | 30 | 0.824 | 0.760 | 0.400 | 0.181 | 0.078 | 0.033 |
| Comparative Example 8-2 | 50 | 30 | 0.767 | 0.882 | 0.536 | 0.271 | 0.129 | 0.061 |
| Example 8-3 | 25 | 30 | 0.846 | 0.682 | 0.363 | 0.163 | 0.070 | 0.030 |
| Comparative Example 8-3 | 25 | 30 | 0.814 | 0.823 | 0.513 | 0.263 | 0.126 | 0.059 |
| Example 8-4 | 100 | 60 | 0.905 | 0.895 | 0.623 | 0.373 | 0.211 | 0.116 |
| Comparative Example 8-4 | 100 | 60 | 0.869 | 0.919 | 0.771 | 0.496 | 0.299 | 0.176 |

Figure 6B:
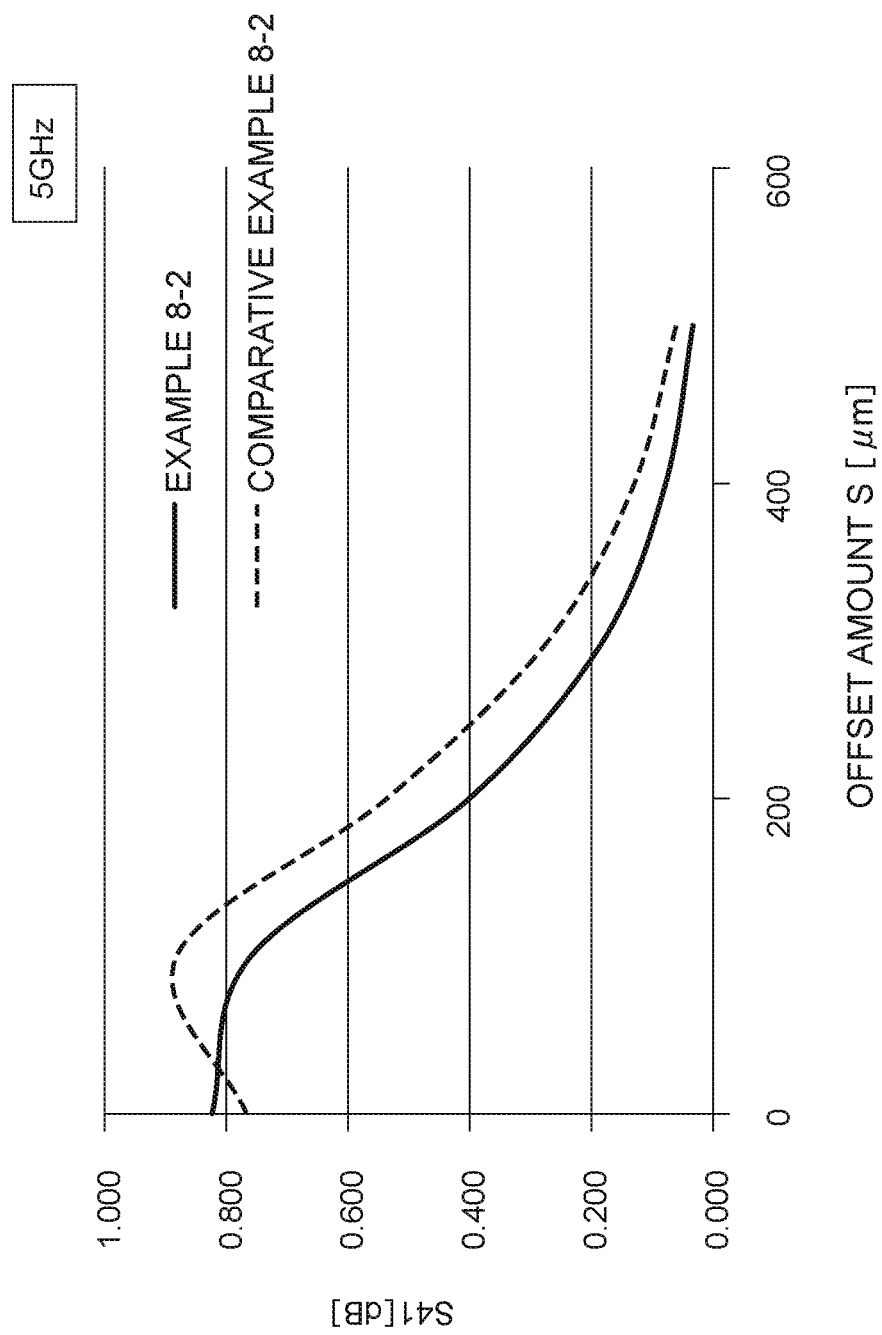
FIG. 6B is a graph illustrating measurement results of crosstalk S41 at a frequency of 5 GHz when the offset amount S is varied in Structure 2.
Figure 6C:
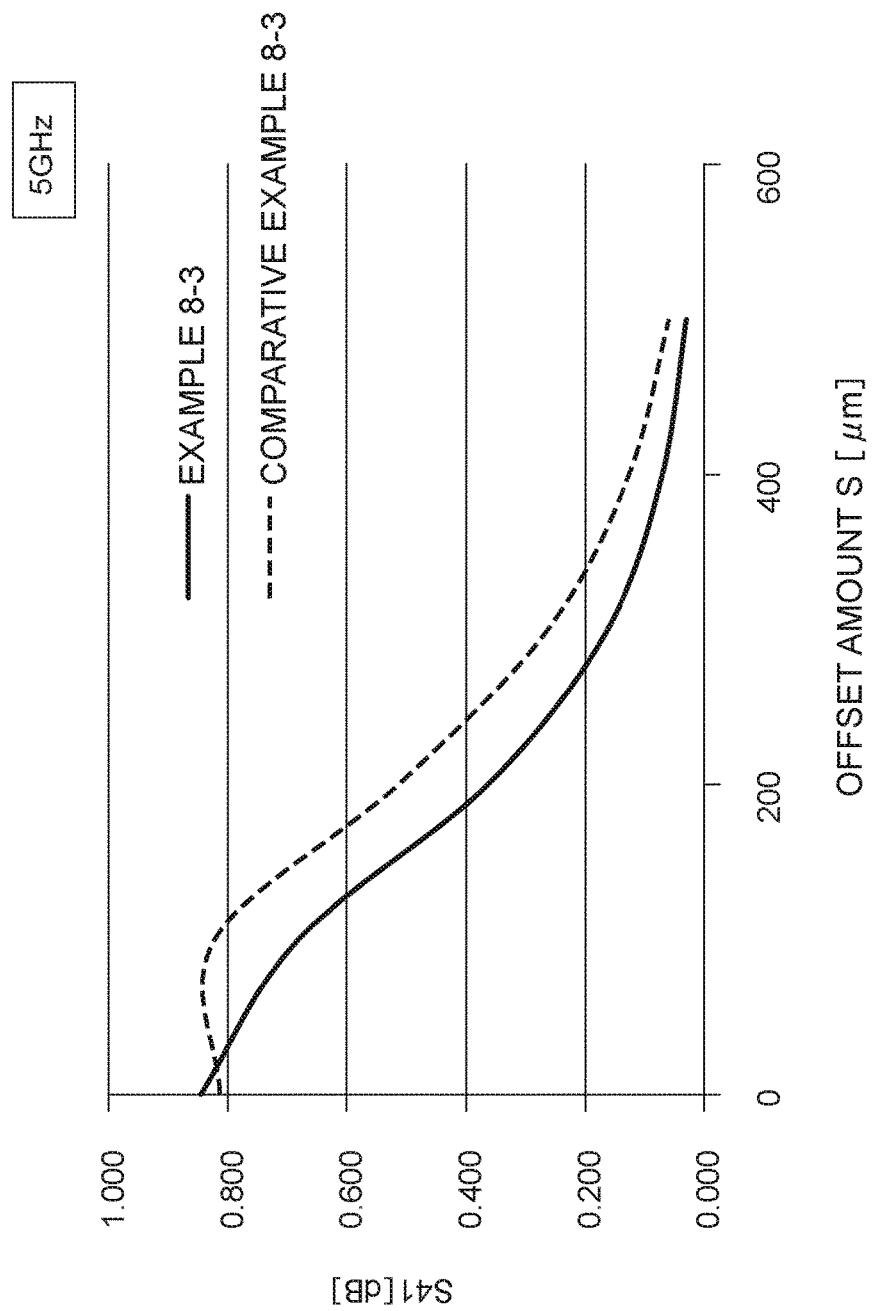
FIG. 6C is a graph illustrating measurement results of crosstalk S41 at a frequency of 5 GHz when the offset amount S is varied in Structure 3.
Figure 6D:
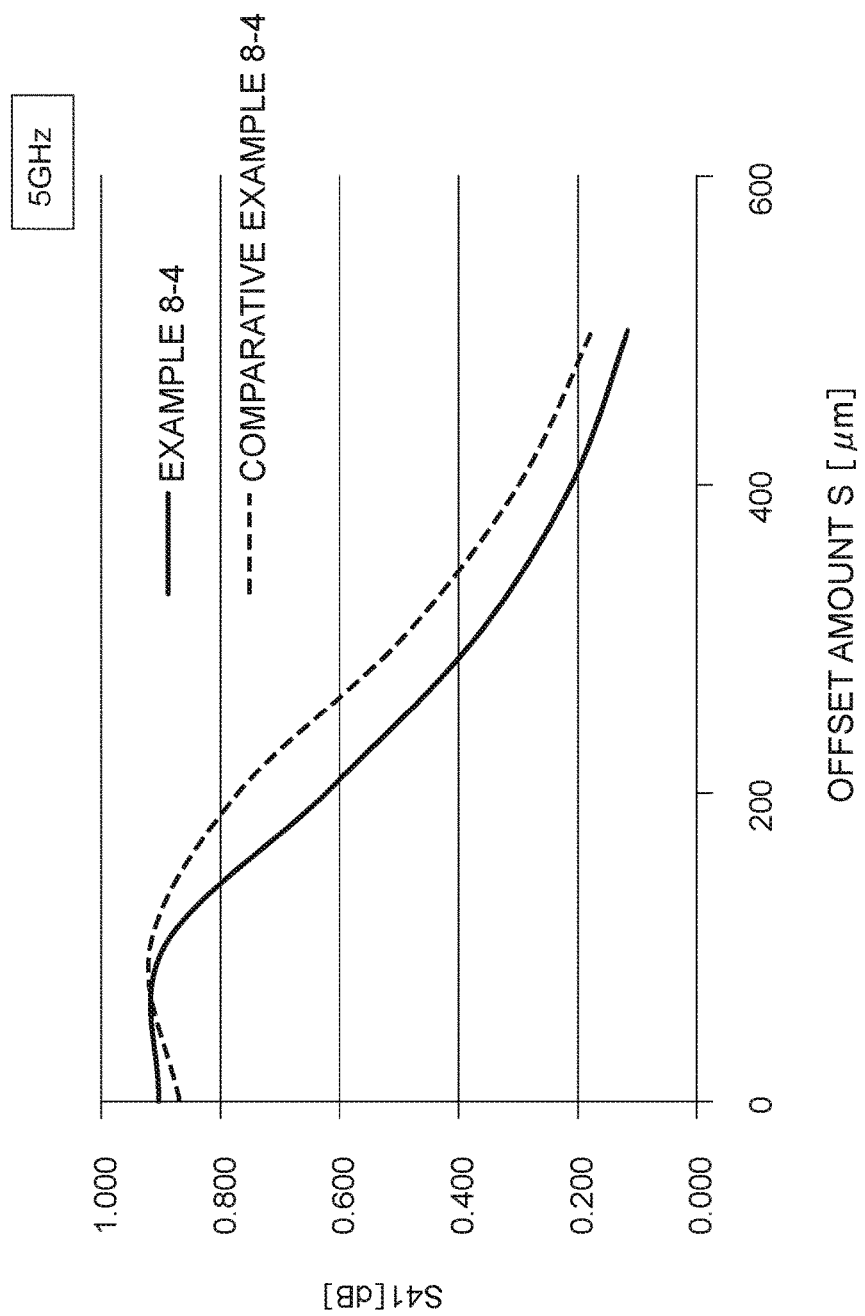
FIG. 6D is a graph illustrating measurement results of crosstalk S41 at a frequency of 5 GHz when the offset amount S is varied in Structure 4.

FIG. 6A illustrates the measurement results of the crosstalk S41 to the offset amount in Example 8-1 and Comparative Example 81 which are provided with Structure 1. FIG. 6B illustrates the measurement results of the crosstalk S41 to the offset amount in Example 8-2 and Comparative Example 8-2 which are provided with Structure 2. FIG. 6C illustrates the measurement results of the crosstalk S41 to the offset amount in Example 8-3 and Comparative Example 8-3 which are provided with Structure 3. FIG. 6D illustrates the measurement results of the crosstalk S41 to the offset amount in Example 8-4 and Comparative Example 8-4 which are provided with Structure 4. Solid lines represent the examples and broken lines represent the comparative examples.

As listed in Tables 3 to 10 and illustrated in FIG. 4A to FIG. 4D, FIG. 5A to FIG. 5D, and FIG. 6A to FIG. 6D, when the offset amount S is 400 [μm] or less, the measurement results of the crosstalk S41 in the printed wiring boards 1 of Examples 1-1 to 1-4 are lower than the measurement results of the crosstalk S41 in the printed wiring boards 1' of Comparative Examples 1-1 to 1-4 and show good values. The measurement results of the crosstalk S41 in the printed wiring boards 1 of Examples 2-1 to 2-4 are lower than the measurement results of the crosstalk S41 in the printed wiring boards 1' of Comparative Examples 2-1 to 2-4 and show good values. The measurement results of the crosstalk S41 in the printed wiring boards 1 of Examples 3-1 to 3-4 are lower than the measurement results of the crosstalk S41 in the printed wiring boards 1' of Comparative Examples 3-1 to 3-4 and show good values. The measurement results of the crosstalk S41 in the printed wiring boards 1 of Examples 4-1 to 4-4 are lower than the measurement results of the crosstalk S41 in the printed wiring boards 1' of Comparative Examples 4-1 to 4-4 and show good values. The measurement results of the crosstalk S41 in the printed wiring boards 1 of Examples 5-1 to 5-4 are lower than the measurement results of the crosstalk S41 in the printed wiring boards 1' of Comparative Examples 5-1 to 5-4 and show good values. The measurement results of the crosstalk S41 in the printed wiring boards 1 of Examples 6-1 to 6-4 are lower than the measurement results of the crosstalk S41 in the printed wiring boards 1' of Comparative Examples 6-1 to 6-4 and show good values. The measurement results of the crosstalk S41 in the printed wiring boards 1 of Examples 7-1 to 7-4 are lower than the measurement results of the crosstalk S41 in the printed wiring boards 1' of Comparative Examples 7-1 to 7-4 and show good values. The measurement results of the crosstalk S41 in the printed wiring boards 1 of Examples 8-1 to 8-4 are lower than the measurement results of the crosstalk S41 in the printed wiring boards 1' of Comparative Examples 8-1 to 8-4 and show good values. Moreover, when the offset amount S is 300 [μm] or less, the measurement results of the crosstalk S41 in the printed wiring board 1 of each example exhibit advantageous differences to the measurement results of the crosstalk S41 in the printed wiring board 1' of the corresponding comparative example. Furthermore, when the offset amount S is 200 [μm] or less, the measurement results of the crosstalk S41 in the printed wiring board 1 of each example exhibit more advantageous differences to the measurement results of the crosstalk S41 in the printed wiring board 1' of the corresponding comparative example.

In particular, when the frequency of transmitted signals is less than 5.0 GHz and the offset amount S is 400 [μm] or less, the measurement results of the crosstalk S41 in the printed wiring board 1 of each example tend to show lower values than the measurement results of the crosstalk S41 in the printed wiring board 1' of the corresponding comparative example and exhibit good results. Similarly, when the frequency of transmitted signals is less than 5.0 GHz and the offset amount S is 300 [μm] or less, the measurement results of the crosstalk S41 in the printed wiring board 1 of each example tend to show lower values than the measurement results of the crosstalk S41 in the printed wiring board 1' of the corresponding comparative example. Similarly, when the frequency of transmitted signals is less than 5.0 GHz and the offset amount S is 200 [μm] or less, the measurement results of the crosstalk S41 in the printed wiring board 1 of each example tend to show further lower values than the measurement results of the crosstalk S41 in the printed wiring board 1' of the corresponding comparative example and exhibit advantageous differences.

When the frequency of transmitted signals is at least less than 2.5 GHz and the offset amount S is 400 [μm] or less, the measurement results of the crosstalk S41 in the printed wiring board 1 of each example are lower than the measurement results of the crosstalk S41 in the printed wiring board 1' of the corresponding comparative example and show good values. Similarly, when the frequency of transmitted signals is less than 2.5 GHz and the offset amount S is 300 [μm] or less, the measurement results of the crosstalk S41 in the printed wiring board 1 of each example exhibit advantageous differences to the measurement results of the crosstalk S41 in the printed wiring board 1' of the corresponding comparative example. Similarly, when the frequency of transmitted signals is less than 2.5 GHz and the offset amount S is 200 [μm] or less, the measurement results of the crosstalk S41 in the printed wiring board 1 of each example exhibit further advantageous differences to the measurement results of the crosstalk S41 in the printed wiring board 1' of the corresponding comparative example.

When the frequency of transmitted signals is 2.5 GHz and the offset amount S is 22 [μm] or more and 400 [μm] or less, the measurement results of the crosstalk S41 [dB] in the printed wiring board 1 of Example 7-1 having Structure 1 show better values than those of the crosstalk S41 in the printed wiring board 1' according to Comparative Example 7-1. When the frequency of transmitted signals is 2.5 GHz and the offset amount S is 400 [μm] or less, the measurement results of the crosstalk S41 [dB] in the printed wiring board 1 of Example 7-2 having Structure 2 show better values than those of the crosstalk S41 in the printed wiring board 1' according to Comparative Example 7-2. When the frequency of transmitted signals is 2.5 GHz and the offset amount S is 400 [μm] or less, the measurement results of the crosstalk S41 [dB] in the printed wiring board 1 of Example 7-3 having Structure 3 show better values than those of the crosstalk S41 in the printed wiring board 1' according to Comparative Example 7-3. When the offset amount S is 400 [μm] or less, the measurement results of the crosstalk S41 [dB] in the printed wiring board 1 of Example 7-4 having Structure 4 show better values than those of the crosstalk S41 in the printed wiring board 1' according to Comparative Example 7-4.

When the frequency of transmitted signals is 5.0 GHz and the offset amount S is 130 [μm] or more and 400 [μm] or less, the measurement results of the crosstalk S41 [dB] in the printed wiring board 1 of Example 8-1 having Structure 1 show better values than those of the crosstalk S41 in the printed wiring board 1' according to Comparative Example 8-1. When the frequency of transmitted signals is 5.0 GHz and the offset amount S is 42 [μm] or more, the measurement results of the crosstalk S41 in the printed wiring board 1 of Example 8-2 having Structure 2 show better values than those of the crosstalk S41 in the printed wiring board 1' according to Comparative Example 8-2. When the frequency of transmitted signals is 5.0 GHz and the offset amount S is 20 [μm] or more, the measurement results of the crosstalk S41 [dB] in the printed wiring board 1 of Example 8-3 having Structure 3 show better values than those of the crosstalk S41 in the printed wiring board 1' according to Comparative Example 8-3. When the offset amount S is 76 [μm] or more, the measurement results of the crosstalk S41 [dB] in the printed wiring board 1 of Example 8-4 having Structure 4 show better values than those of the crosstalk S41 in the printed wiring board 1' according to Comparative Example 8-4.

Next, for Examples 101 to 10-8 provided with Structure 1 and Comparative Examples 10-1 to 10-8 provided with Structure 1, the transmission characteristic S31 [dB] when changing the offset amount S at each frequency was measured and compared. The transmission characteristic S31 [dB] measured in the present embodiment is a measured value that is indicative of how much the input signals are output. In other words, the transmission characteristic S31 [dB] is an index value that is indicative of how much the signals flow for the input signals. The transmission characteristic S31 in the present embodiment takes a value of 0 to 1. In the present embodiment, an example with a value of the transmission characteristic S31 nearer to 1.0 (i.e. having a smaller difference from 1.0) is evaluated as exhibiting better transmission characteristics.

Table 11 below lists the measurement results of the transmission characteristic S31 [dB] at a frequency of transmitted signals of 700 MHz to 5.0 GHz. Examples 10-1 to Examples 10-8 are provided with Structure 1. Comparative Examples 10-1 to 10-8 are also provided with Structure 1.

TABLE 11

Test Results of Transmission Characteristic S31 of Structure 1 at Each Frequency

| | | Offset amount S [μm] | | | | | |
|---|---|---|---|---|---|---|---|
| | | 0 | 100 | 200 | 300 | 400 | 500 |
| Example 10-1 | 700 MHz | 0.825 | 0.922 | 0.993 | 0.999 | 1.000 | 1.000 |
| Comparative Example 10-1 | | 0.729 | 0.885 | 0.986 | 0.997 | 0.999 | 0.999 |
| Example 10-2 | 800 MHz | 0.807 | 0.909 | 0.991 | 0.999 | 1.000 | 1.000 |
| Comparative Example 10-2 | | 0.717 | 0.870 | 0.983 | 0.996 | 0.999 | 0.999 |
| Example 10-3 | 900 MHz | 0.794 | 0.897 | 0.990 | 0.998 | 1.000 | 1.000 |
| Comparative Example 10-3 | | 0.711 | 0.858 | 0.980 | 0.996 | 0.999 | 0.999 |
| Example 10-4 | 1.5 GHz | 0.788 | 0.867 | 0.979 | 0.996 | 0.999 | 1.000 |
| Comparative Example 10-4 | | 0.747 | 0.842 | 0.965 | 0.992 | 0.997 | 0.998 |
| Example 10-5 | 1.7 GHz | 0.796 | 0.866 | 0.975 | 0.996 | 0.999 | 1.000 |
| Comparative Example 10-5 | | 0.665 | 0.842 | 0.961 | 0.991 | 0.997 | 0.998 |
| Example 10-6 | 2.0 GHz | 0.745 | 0.859 | 0.971 | 0.995 | 0.999 | 1.000 |
| Comparative Example 10-6 | | 0.394 | 0.807 | 0.956 | 0.989 | 0.997 | 0.999 |
| Example 10-7 | 2.5 GHz | 0.501 | 0.778 | 0.963 | 0.993 | 0.999 | 1.000 |
| Comparative Example 10-7 | | 0.297 | 0.634 | 0.942 | 0.987 | 0.997 | 0.999 |
| Example 10-8 | 5.0 GHz | 0.192 | 0.276 | 0.862 | 0.972 | 0.995 | 0.999 |
| Comparative Example 10-8 | | 0.633 | 0.080 | 0.779 | 0.947 | 0.987 | 0.996 |

Figure 7F:
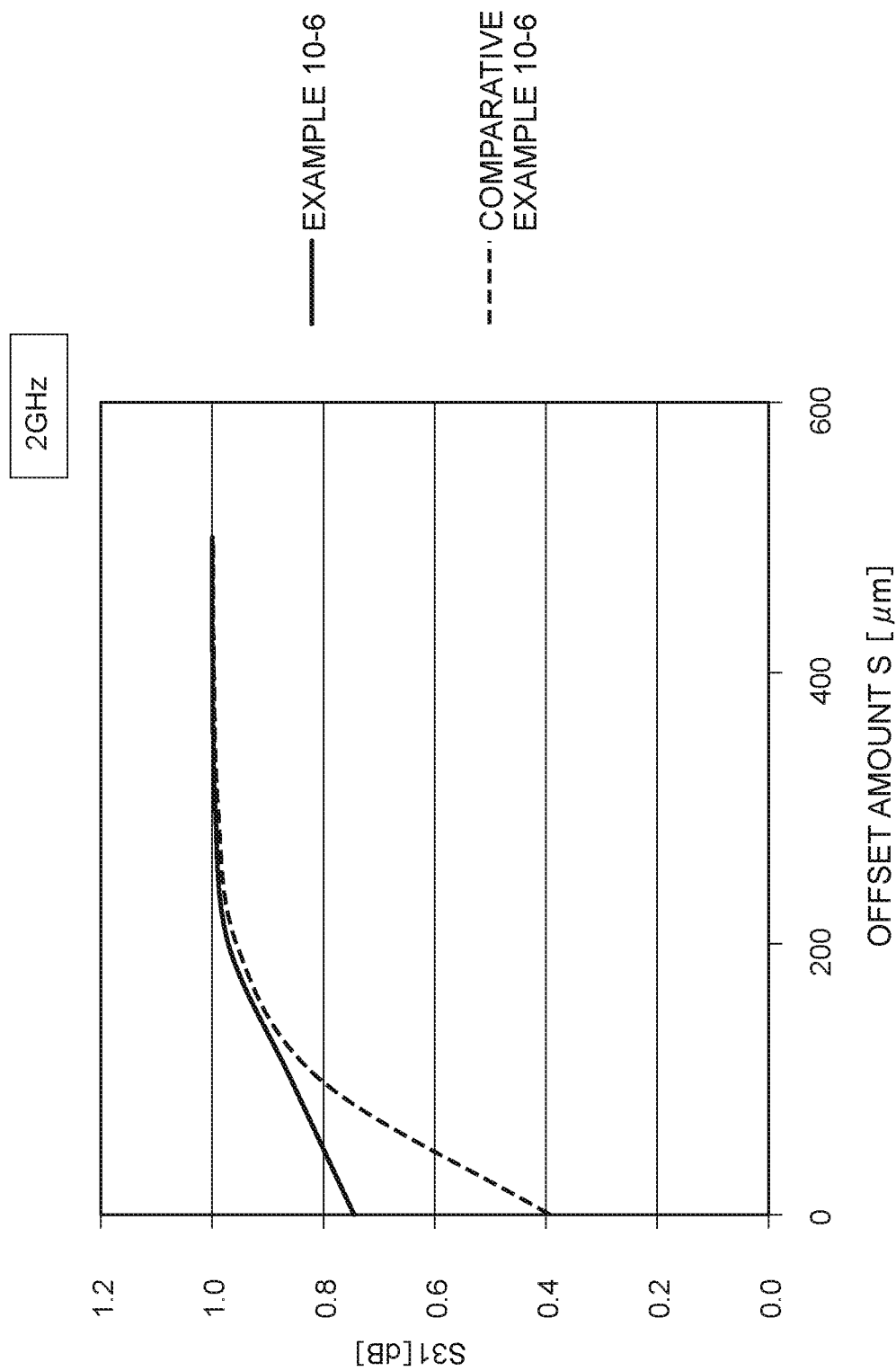
FIG. 7F is a graph illustrating measurement results of crosstalk S31 at a frequency of 2 GHz when the offset amount S is varied in Structure 1.
Figure 7G:
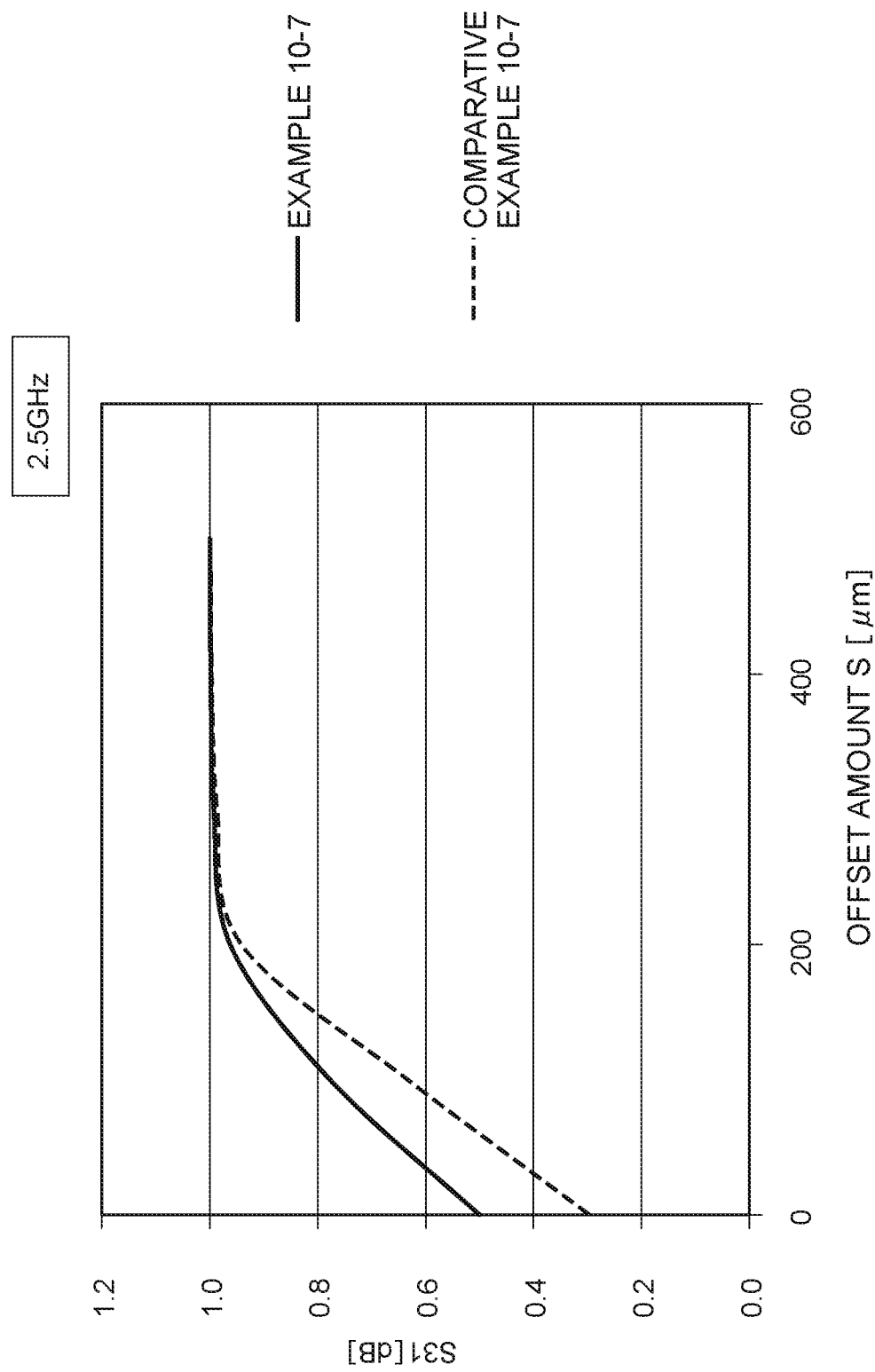
FIG. 7G is a graph illustrating measurement results of crosstalk S31 at a frequency of 2.5 GHz when the offset amount S is varied in Structure 1.
Figure 7H:
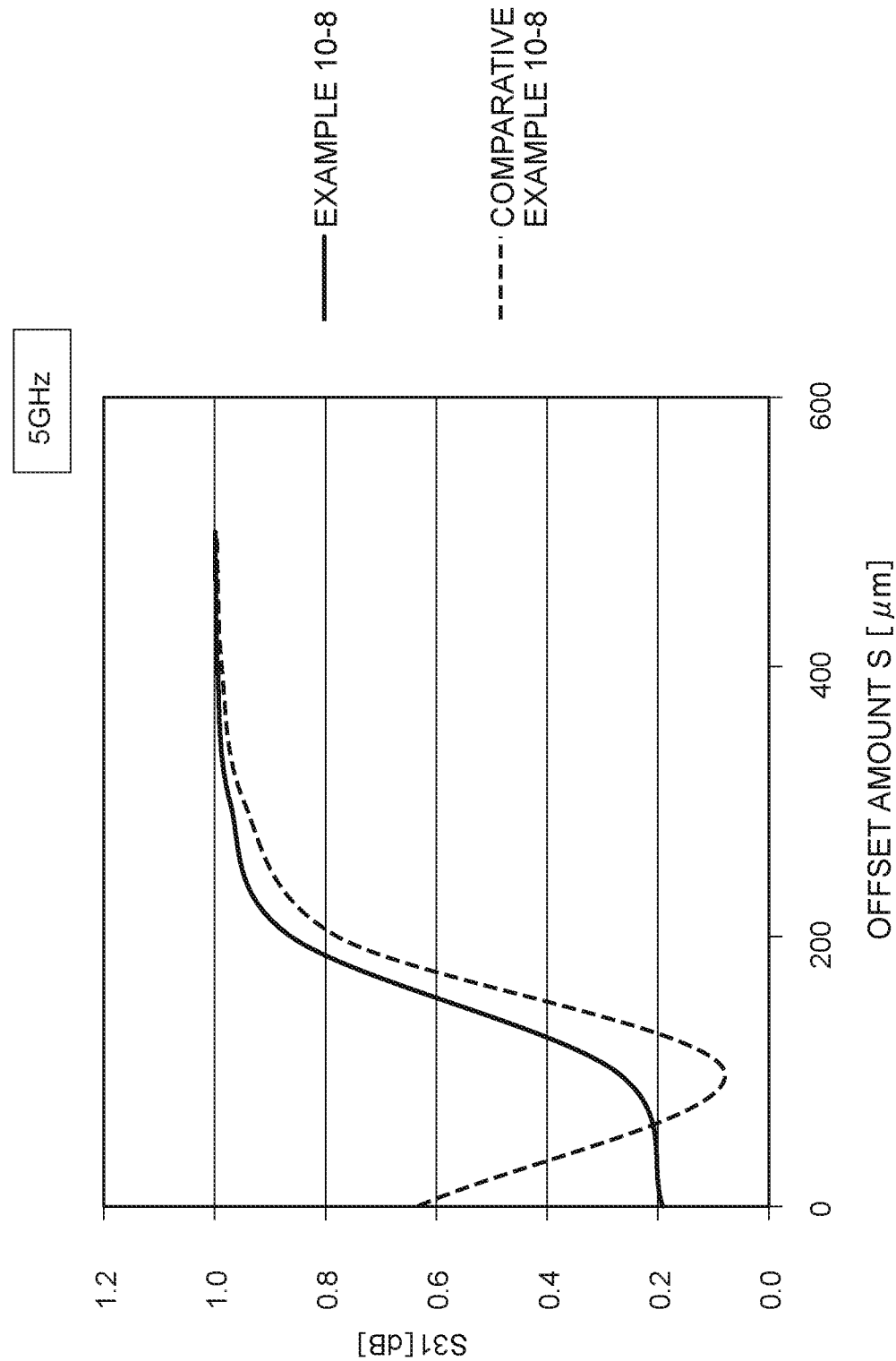
FIG. 7H is a graph illustrating measurement results of crosstalk S31 at a frequency of 5 GHz when the offset amount S is varied in Structure 1.

FIG. 7A illustrates the measurement results of the transmission characteristic S31 to the offset amount in Example 10-1 and Comparative Example 10-1 in which the frequency of transmitted signals is 700 MHz. FIG. 7B illustrates the measurement results of the transmission characteristic S31 to the offset amount in Example 10-2 and Comparative Example 10-2 in which the frequency of transmitted signals is 800 MHz. FIG. 7C illustrates the measurement results of the transmission characteristic S31 to the offset amount in Example 10-3 and Comparative Example 10-3 in which the frequency of transmitted signals is 900 MHz, FIG. 7D illustrates the measurement results of the transmission characteristic S31 to the offset amount in Example 10-4 and Comparative Example 10-4 in which the frequency of transmitted signals is 1.5 GHz. FIG. 7E illustrates the measurement results of the transmission characteristic S31 to the offset amount in Example 10-5 and Comparative Example 10-5 in which the frequency of transmitted signals is 1.7 GHz. FIG. 7F illustrates the measurement results of the transmission characteristic S31 to the offset amount in Example 10-6 and Comparative Example 10-6 in which the frequency of transmitted signals is 2.0 GHz. FIG. 7G illustrates the measurement results of the transmission characteristic S31 to the offset amount in Example 10-7 and Comparative Example 10-7 in which the frequency of transmitted signals is 2.5 GHz. FIG. 7H illustrates the measurement results of the transmission characteristic S31 to the offset amount in Example 10-8 and Comparative Example 10-8 in which the frequency of transmitted signals is 5.0 GHz.

Solid lines represent the examples and broken lines represent the comparative examples. As illustrated in FIG. 7A to FIG. 7H, the measurement results of the transmission characteristic S31 in the printed wiring board 1 according to each example are nearer to 1.0 than the measurement results of the printed wiring board 1' of the corresponding comparative example and show good values. The patterns of transmission characteristic S31 in the examples in which the frequency of transmitted signals is 700 MHz to 2.5 GHz are approximately the same.

As listed in Table 11 and illustrated in FIG. 7A to FIG. 7H, when the offset amount S is 400 [µm] or less, the measurement results of the transmission characteristic S31 in the printed wiring boards 1 of Examples 10-1 to 10-8 show values that are nearer to 1 than the measurement results of the transmission characteristic S31 in the printed wiring boards 1' of Comparative Examples 10-1 to 10-8 or values that are comparable with 1. Moreover, when the offset amount S is 300 [µm] or less, the measurement results of the transmission characteristic S31 in the printed wiring boards 1 of Examples 10-1 to 10-8 show values that are more nearer to 1.0 than the measurement results of the transmission characteristic S31 in the printed wiring boards 1' of Comparative Examples 10-1 to 10-8 or values that are comparable with 1.0. In particular, when the offset amount S is 200 [µm] or less, the measurement results of the transmission characteristic S31 in the printed wiring boards 1 of Examples 101 to 10-8 show values that are nearer to 1.0 than the measurement results of the transmission characteristic S31 in the printed wiring boards 1' of Comparative Examples 10-1 to 10-8.

When the frequency of transmitted signals is less than 5.0 GHz and the offset amount S is 200 [µm] or less, the measurement results of the transmission characteristic S31 in the printed wiring boards 1 of Examples 10-1 to 10-7 show values that are nearer to 1.0 than the measurement results of the transmission characteristic S31 in the printed wiring boards 1' of Comparative Examples 10-1 to 10-7.

When the frequency of transmitted signals is at least 2.5 GHz or less and the offset amount S is 400 [µm] or less, the measurement results of the transmission characteristic S31 in the printed wiring boards 1 of Examples 10-1 to 10-7 show values that are nearer to 1.0 than the measurement results of the transmission characteristic S31 in the printed wiring boards 1' of Comparative Examples 10-1 to 10-7 or values that are comparable with 1.0. Similarly, when the frequency of transmitted signals is 2.5 GHz or less and the offset amount S is 300 [µm] or less, the above effect can be confirmed. Similarly, when the frequency of transmitted signals is 2.5 GHz or less and the offset amount S is 200 [µm] or less, the measurement results of the transmission characteristic S31 in the printed wiring boards 1 of Examples 10-1 to 10-7 show values that are nearer to 1.0 than the measurement results of the transmission characteristic S31 in the printed wiring boards 1' of Comparative Examples 10-1 to 10-7.

When the frequency of transmitted signals is 5.0 GHz and the offset amount S is 400 [µm] or less, the measurement results of the transmission characteristic S31 in the printed wiring board 1 of Example 10-8 show values that are nearer to 1.0 than the measurement results of the transmission characteristic S31 in the printed wiring board 1' of Comparative Example 10-8. When the frequency of transmitted signals is 5.0 GHz and the offset amount S is 300 [µm] or less, the measurement results of the transmission characteristic S31 in the printed wiring board 1 of Example 10-8 show values that are more nearer to 1.0 than the measurement results of the transmission characteristic S31 in the printed wiring board 1' of Comparative Example 10-8. When the frequency of transmitted signals is 5.0 GHz and the offset amount S is 200 [µm] or less, the measurement results of the transmission characteristic S31 in the printed wiring board 1 of Example 10-8 show values that are more nearer to 1.0 than the measurement results of the transmission characteristic S31 in the printed wiring board 1' of Comparative Example 10-8. When the frequency of transmitted signals is 5.0 GHz and the offset amount S is 61 [µm] or more, the measurement results of the transmission characteristic S31 in the printed wiring board 1 of Example 10-8 show values that are more nearer to 1.0 than the measurement results of the transmission characteristic S31 in the printed wiring board 1' of Comparative Example 10-8.

When the frequency of transmitted signals is 5.0 GHz and the offset amount S is 155 [µm] or more, the measurement results of the transmission characteristic S31 in the printed wiring board 1 of Example 10-8 show better values of 0.6 or more, at such a high frequency, than those of Comparative Example 10-8. When the offset amount S is 174 [µm] or more, the measurement results of the transmission characteristic S31 in the printed wiring board 1 of Example 10-8 show better values of 0.8 or more, at such a high frequency, than those of Comparative Example 10-8.

The printed wiring board 1 of the present examples is provided with a structure that comprises the first insulating substrate 11 composed of a liquid crystal polymer, the first signal line 131 formed on one main surface 11a of the first insulating substrate 11, the second insulating substrate 21 composed of a liquid crystal polymer, the second signal line 231 formed on one main surface 21a of the second insulating substrate 21 and along the extending direction of the first signal line 131, and the adhesion layer 30 composed of modified polyphenylene ether for adhesion between the one main surface 11a of the first insulating substrate 11 and the one main surface 21a of the second insulating substrate 21. In this structure, the offset amount S, which is the distance from the position P1 of one end of the first signal line 131 farthest from the second signal line 231 along the width direction to the position P2 of one end of the second signal line 231 nearest to the first signal line 131 along the width direction, can be longer than the circuit width L1 of the first signal line 131 and 300 [µm] or less. Therefore, the printed wiring board 1 responsible to a reduced thickness and reduced size can be provided while maintaining the transmission characteristics. In particular, when the printed wiring board 1 includes a plurality of signal lines, the amount of accumulated pitch widths can be reduced, and the printed wiring board 1 suitable for a reduced thickness and reduced size can thus be provided.

Moreover, the transmission characteristics can be maintained even when the offset amount is 200 [µm] or less, and the present invention can therefore contribute to a further reduced thickness and size. In particular, the offset amount S can be reduced in the printed wiring board 1 which transmits high-frequency signals.

Since the offset amount between signal lines can be reduced, the degree of freedom in designing is enhanced and the present invention can respond to various wiring patterns.

Signal lines can transmit signals of difference frequencies because each signal line can maintain its transmission characteristics. More specifically, the first signal line can transmit signals of a first frequency while the second signal line can transmit signals of a second frequency. This can respond to the demand for transmitting signals of multiple frequencies in one device.

Embodiments heretofore explained are described to facilitate understanding of the present invention and are not described to limit the present invention. Therefore, it is intended that the elements disclosed in the above embodiments include all design changes and equivalents to fall within the technical scope of the present invention.

DESCRIPTION OF REFERENCE NUMERALS

1 Printed wiring board
11 First insulating substrate
131, 132, 133 First signal line
12 First ground layer
21 Second insulating substrate
231, 232, 233 Second signal line
20 Second substrate
22 Second ground layer
30 Adhesion layer
41, 42 Protection layer
TH Through-hole
50 Interlayer conducting layer

The invention claimed is:

1. A printed wiring board comprising:
a first insulating substrate composed of a liquid crystal polymer;
a first signal line formed on one main surface of the first insulating substrate;
a second insulating substrate composed of a liquid crystal polymer;
a second signal line, which is offset from the first signal line, formed on one main surface of the second insulating substrate and along an extending direction of the first signal line; and
an adhesion layer composed of a modified polyphenylene ether for adhesion between the one main surface of the first insulating substrate and the one main surface of the second insulating substrate,
wherein, when frequencies of signals transmitted by the first signal line and the second signal line are 2.5 GHz or more and 5.0 GHz or less, an offset amount is greater than a circuit width of the first signal line and the offset amount is 130 µm or more and 300 µm or less, wherein the offset amount is a distance between a position of one end of the first signal line farthest from the second signal line along a width direction of the first signal line and a position of one end of the second signal line nearest to the first signal line along a width direction of the second signal line.

2. The printed wiring board according to claim 1, wherein the offset amount is less than 200 µm and greater than 130 µm.

3. The printed wiring board according to claim 1, wherein the first signal line transmits a signal of a first frequency and the second signal line transmits a signal of a second frequency that is different from the first frequency.

* * * * *